United States Patent
Ohuchi et al.

(10) Patent No.: US 6,576,562 B2
(45) Date of Patent: Jun. 10, 2003

(54) MANUFACTURING METHOD OF SEMICONDUCTOR DEVICE USING MASK PATTERN HAVING HIGH ETCHING RESISTANCE

(75) Inventors: Junko Ohuchi, Yokohama (JP); Yasuhiko Sato, Yokosuka (JP); Eishi Shiobara, Inagi (JP); Hisataka Hayashi, Yokohama (JP); Tokuhisa Ohiwa, Kawasaki (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/014,459

(22) Filed: Dec. 14, 2001

(65) Prior Publication Data

US 2002/0119612 A1 Aug. 29, 2002

(30) Foreign Application Priority Data

Dec. 15, 2000 (JP) .......................... 2000-381410

(51) Int. Cl.$^7$ ............................................ H01L 21/302
(52) U.S. Cl. ..................................................... 438/725
(58) Field of Search ................................ 438/558, 725, 438/704

(56) References Cited

U.S. PATENT DOCUMENTS 5,022,959 A * 6/1991 Itoh ............................ 216/49
5,523,257 A * 6/1996 Yamazaki .................... 438/166
5,759,746 A     6/1998 Azuma et al.
5,932,491 A * 8/1999 Wald et al. .................. 438/734
6,177,353 B1 * 1/2001 Gutsche et al. ............. 438/704

OTHER PUBLICATIONS

Sato, Y. et al., "Method of Forming a Pattern", U.S. Ser. No.: 09/814,839, Filed: Mar. 23, 2001, Specification—51 pages, and 4 sheets of drawings.

Sato, Y. et al., "Method of Forming a Pattern", U.S. Ser. No.: 09/512,286, Filed: Feb. 24, 2000, Specification—137 pages, and 18 sheets of drawings.

Matsuo, M. et al., "Stacked Circuit Device and Method for Evaluating an Integrated Circuit Substrate Using the Stacked Circuit Device", U.S. Ser. No.: 09/957,510, Filed: Sep. 21, 2001, Specification—17 pages, and 5 sheets of drawings.

* cited by examiner

Primary Examiner—David Nelms
Assistant Examiner—Thao P Le
(74) Attorney, Agent, or Firm—Finnegan, Henderson, Farabow, Garrett & Dunner L.L.P.

(57) ABSTRACT

A manufacturing method of semiconductor device comprises forming a mask material having an aromatic ring and carbon content of 80 wt % or more on an object, forming a mask material pattern by etching the mask material to a desired pattern, and etching the object to transfer the mask material pattern as a mask to the object.

23 Claims, 6 Drawing Sheets

MANUFACTURING METHOD OF SEMICONDUCTOR DEVICE USING MASK PATTERN HAVING HIGH ETCHING RESISTANCE

CROSS-REFERENCE TO RELATED APPLICATIONS

This application is based upon and claims the benefit of priority from the prior Japanese Patent Application No. 2000-381410, filed Dec. 15, 2000, the entire contents of which are incorporated herein by reference.

BACKGROUND OF THE INVENTION

1. Field of the Invention

The present invention relates to a manufacturing method of semiconductor device using a mask pattern whose etch profile upon etching processing is improved, and more particularly to a manufacturing method of semiconductor device in which a object to be processed is processed with the mask pattern formed by processing a multi-layered film.

2. Description of the Related Art

The manufacturing method of semiconductor device includes a number of steps in which plural kinds of substances are deposited on a silicon wafer as films to be processed and the films are patterned into a desired pattern. The patterning of the films is carried out in the following process. First, a photosensitive material generally called resist is deposited on the film to be processed so as to form a resist film on the film. Subsequently, a predetermined region of the resist film is exposed to light. Next, an exposed portion or non-exposed portion of the resist film is removed by development processing so as to form a resist pattern. Further, by dry etching the film to be processed with the resist pattern as an etching mask, patterning of the film is carried out.

To keep a necessary resolution, exposure amount tolerance or focus tolerance at the time of the pattern exposure, the resist film thickness is required to be reduced. For the reason, a required film thickness of the resist film cannot be secured in the etching process of the film to be processed. To solve the problem, a method in which a mask material having a higher etching resistance than that of the resist pattern is formed on the film to be processed and then the resist pattern is transferred to the mask material and the film to be processed in succession has been currently applied.

Conventionally, for example, aluminum and the like, or carbon and the like have been used as the mask material. These materials can be formed by a dry method such as CVD method, sputtering method and vapor deposition method. Materials obtained by resins such as novolac resin, polyhydroxy styrene conventionally used in the resists, which are hardened at high temperature. Polysilane is also used for the mask material. Those mask material such as hardening resin and polysilane can be formed by such a wet method as spin coating method.

Because the metal film and carbon for use in forming a film according to the dry method requires a vacuum system, their processing cost is high.

A left mask material pattern after processing of a film to be processed is finished is difficult to remove because polysilane contains inorganic components. Further, a material produced by baking resin used in a photo resist is likely to undergo side etching during etching of the mask material, so that high-precision processing of the mask material pattern is disabled.

When the processing precision of the mask material pattern is reduced by the side-etching, the processing precision of the film to be processed also drops. As a result, there occurs such a problem that reliability upon operation of the semiconductor device drops remarkably. Then, accompanied by accelerated miniaturization of the semiconductor device, an influence of these problems has been increasing more and more.

No mask material preferably used for manufacturing of the semiconductor device has been obtained yet.

BRIEF SUMMARY OF THE INVENTION

According to an aspect of the present invention, there is provided a manufacturing method of semiconductor device comprising: forming a mask material having an aromatic ring and carbon content of 80 wt % or more on an object; forming a mask material pattern by etching the mask material to a desired pattern; and etching the object to transfer the mask material pattern as a mask to the object.

DETAILED DESCRIPTION OF THE INVENTION

The inventors have found that the side-etching value can be reduced largely by using a mask material whose carbon content is 80 wt % or more and have succeeded in completing the present invention.

Hereinafter, the respective embodiments of the present invention will be described with reference to the accompanying drawings.

First Embodiment

First, a manufacturing method of semiconductor device according to a first embodiment of the present invention will be described. As for the first embodiment, a case where a pattern is formed on a film to be processed by processing a multi-layer film and the film to be processed is etched by using the pattern as a mask will be described. After the film is processed to a predetermined shape and dimensions, it is used as a mask material in a process in which a component of a semiconductor device such as pattern of its wiring layer or electrode layer is formed. FIG. 1A to FIG. 1G show sections perpendicular to the longitudinal direction of a wiring layer pattern and a mask pattern.

Figure 1A:
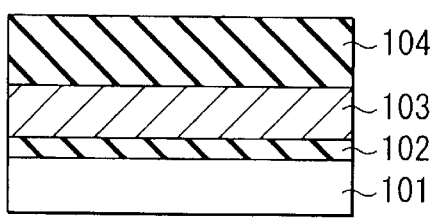
FIG. 1A to FIG. 1I are sectional views of each step showing a manufacturing method of semiconductor device according to an embodiment of the present invention.

First, as shown in FIG. 1A, a polysilicon film 103 is formed on a silicon substrate 101 with an insulating film 102 therebetween by a chemical vapor deposition (CVD) method. The polysilicon film 103 is used as materials for a gate wiring layer, gate electrode or the like. After that, a silicon nitride film 104, which is a object to be processed, is formed about 200 nm in thickness on the polysilicon film 103 by a low-pressure CVD method. The silicon nitride film 104 is used as a mask material in a process for etching the polysilicon film 103 into the shape of the gate wiring layer, gate electrode or the like in a subsequent process.

Although the silicon nitride film 104 is used as the object to be processed here, it is not restricted to the silicon nitride film, but it is permissible to used following materials. As the object to be processed, it is possible to mention, for example, silicon base insulating film such as silicon oxide film, oxide nitride silicon film, and spin on glass; silicon base material such as amorphous silicon, polysilicon and silicon substrate; and wiring material such as aluminum, aluminum silicide, copper and tungsten; and the like. These films may be used as a single layer or layered films of two or more layers. Although the film thickness of the object to be processed varies depending on the purpose, generally, it is preferred to be in a range of 20 to 10,000 nm. The reason is that a film thickness of less than 20 nm is hard to exert an operation which the object to be processed should possess and if the thickness is more than 10,000 nm, the etch bias occurs remarkably when the mask material pattern on the object is transferred to the object.

Figure 1B:
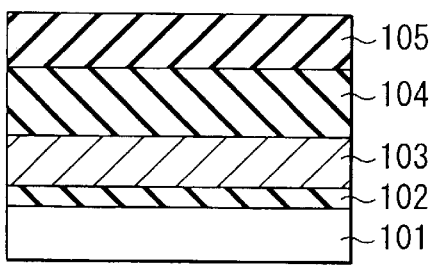
Figure 1C:
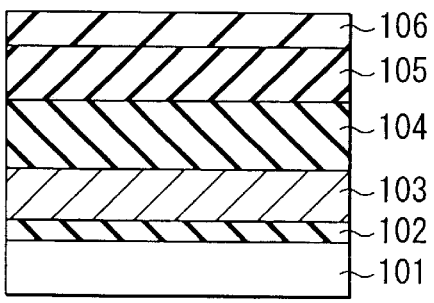
Figure 1D:
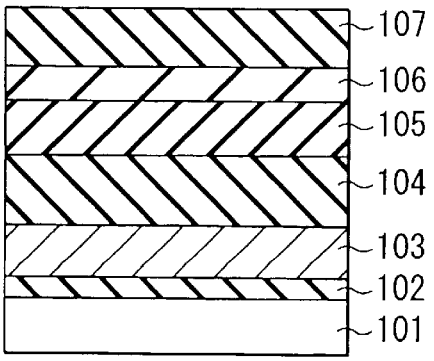

Next, multi-layer of three layer structure comprising a mask material 105, an intermediate layer 106 and a photo resist film 107 is formed on the object 104 which is the object to be processed as shown in FIG. 1B to FIG. 1D. Hereinafter, a forming method of respective layers composing the multi-layer will be described in detail. First, the mask material 105 is formed on the silicon nitride film 104 which is the object to be processed as shown in FIG. 1B. The film thickness of the mask material 105 is preferred to be in a range of 20 to 5,000 nm. The reason is that if the film thickness is less than 20 nm, the mask material 105 is scraped halfway of etching of the object 104 so that the object 104 cannot be processed in a desired dimension and if the film thickness is larger than 5,000 nm, the etch bias occurs remarkably when a resist pattern processed by the photo resist film 107 is transferred to the mask material 105.

Complex refractive indexes n, k under exposure wavelength of the mask material 105 are required to be in a range of $1.0 \leq n \leq 2.5$ and $0.02 \leq k \leq 1.0$ and more preferably, it is in a range of $1.2 \leq n \leq 2.2$ and $0.1 \leq k \leq 1.0$. The reason is that if the n value is less than 1.0 or exceeds 2.5, a difference from the refractive index of resist increases, so that upon pattern exposure, reflection of exposure light is intensified thereby deteriorating dimensional control performance. Further, the reason is that if the k value is less than 0.02, absorption is so low that reflection protection performance drops and conversely if it exceeds 1.0, the absorption is intensified too much, so that the reflection protection performance drops.

The mask material 105 is preferred to be formed by a coating method. The reason is that as compared to the CVD method, the coating method ensures a simpler process and can suppress process cost lower.

The formation method of the mask material 105 by the coating method will be described below. First, an aromatic compound is dissolved in solvent so that carbon content of the mask material becomes 80 wt % or more after by baking the film. As such compound as the mask material, for example, polyarylene which can be expressed with the following formula (1) can be mentioned. Further, it is permissible to use polycyclic aromatic hydrocarbon preferably and for example, a compound in which naphtalene derivatives expressed with the following formula (2) are polymerized or a compound in which anthracene derivatives expressed with the following formula (3) are polymerized can be picked up. As such polymer, it is permissible to polymerize the naphthalene derivative or the anthracene derivative with formaldehyde. As such a compound, it is possible to pick up compounds, which can be expressed with the following formulae (4) to (10). Further, as the polycyclic aromatic hydrocarbon, it is permissible to use petroleum base or petroleum pitch. The petroleum base or the petroleum pitch can be obtained by separating and purifying a component soluble in aromatic and aliphatic hydrocarbons. Further, as other compounds, compounds expressed with the following formulae (11) to (23) may be used. These aromatic compounds have not only a large amount of carbon content and a high etching resistance but also an excellent solubility into solvent because they have an aromatic ring. Thus, by coating with the solution, a coating film of uniform thickness without defect can be obtained.

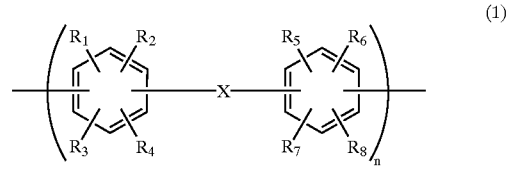

(1)

In the formula (1), X represents a oxygen atom or $-CR_9R_{10}-$. $R_1$ to $R_{10}$ represent a hydrogen atom or a hydroxyl group. Or, $R_1$ to $R_{10}$ represent a substituent containing an aliphatic hydrocarbon, which may be substituted or may be not substituted having 1 to 20 carbon atoms or a substituent containing an aromatic hydrocarbon, which may be substituted or may be not substituted having 6 to 20 carbon atoms. Moreover, $R_1$ to $R_{10}$ preferably represent an alkylene group having 1 to 6 carbon atoms, a hydroxy alkyl group having 1 to 6 carbon atoms, or an alkoxyl group having 1 to 6 carbon atoms. $R_1$ to $R_{10}$ may be the same or different from each other. n represents a positive integer.

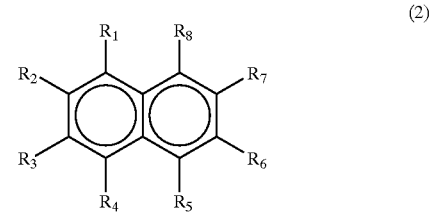

(2)

In the formula (2), $R_1$ to $R_8$ represent a hydrogen atom, a hydroxyl group, an alkylene group having 1 to 6 carbon atoms, a hydroxy alkyl group having 1 to 6 carbon atoms, or an alkoxyl group having 1 to 6 carbon atoms.

(3)

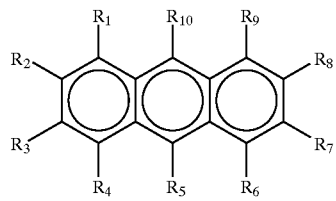

In the formula (3), $R_1$ to $R_{10}$ represent a hydrogen atom, a hydroxyl group, an alkylene group having 1 to 6 carbon atoms, a hydroxy alkyl group having 1 to 6 carbon atoms, or an alkoxyl group having 1 to 6 carbon atoms.

(4)

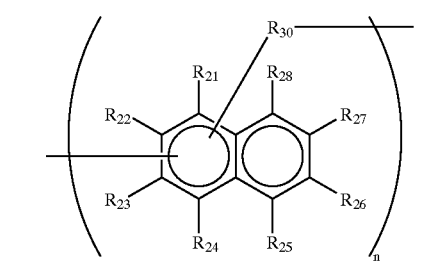

(5)

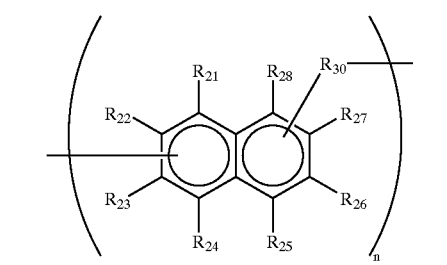

(6)

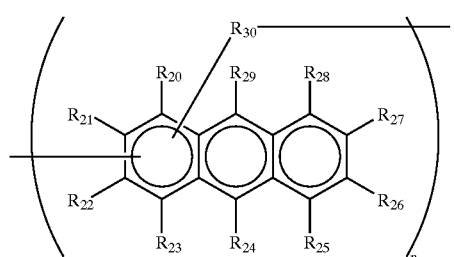

(7)

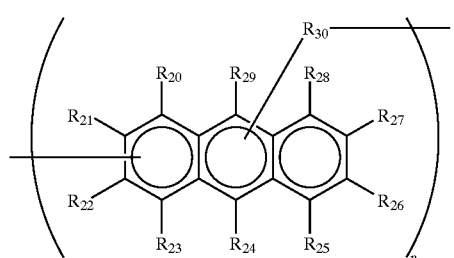

(8)

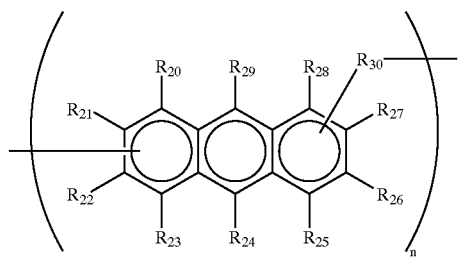

(9)

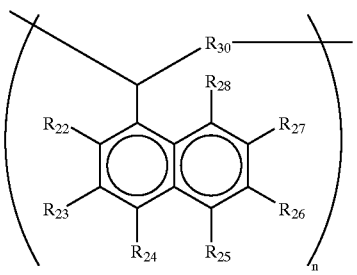

(10)

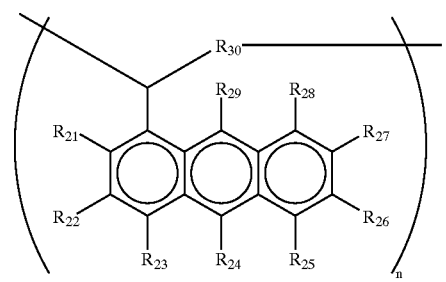

In the formulas (4) to (10), $R_{20}$ to $R_{29}$ represent a substituent containing a hydrogen atom or a hydroxyl group, $R_{30}$ represents an alkylene group having 1 to 6 carbon atoms and n represents a positive integer.

(11)

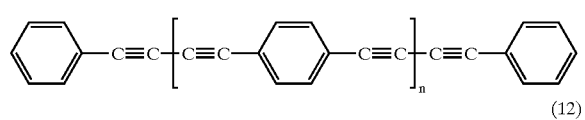

(12)

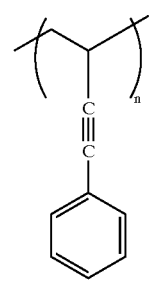

(13)

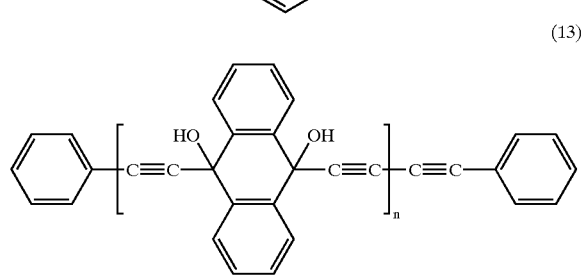

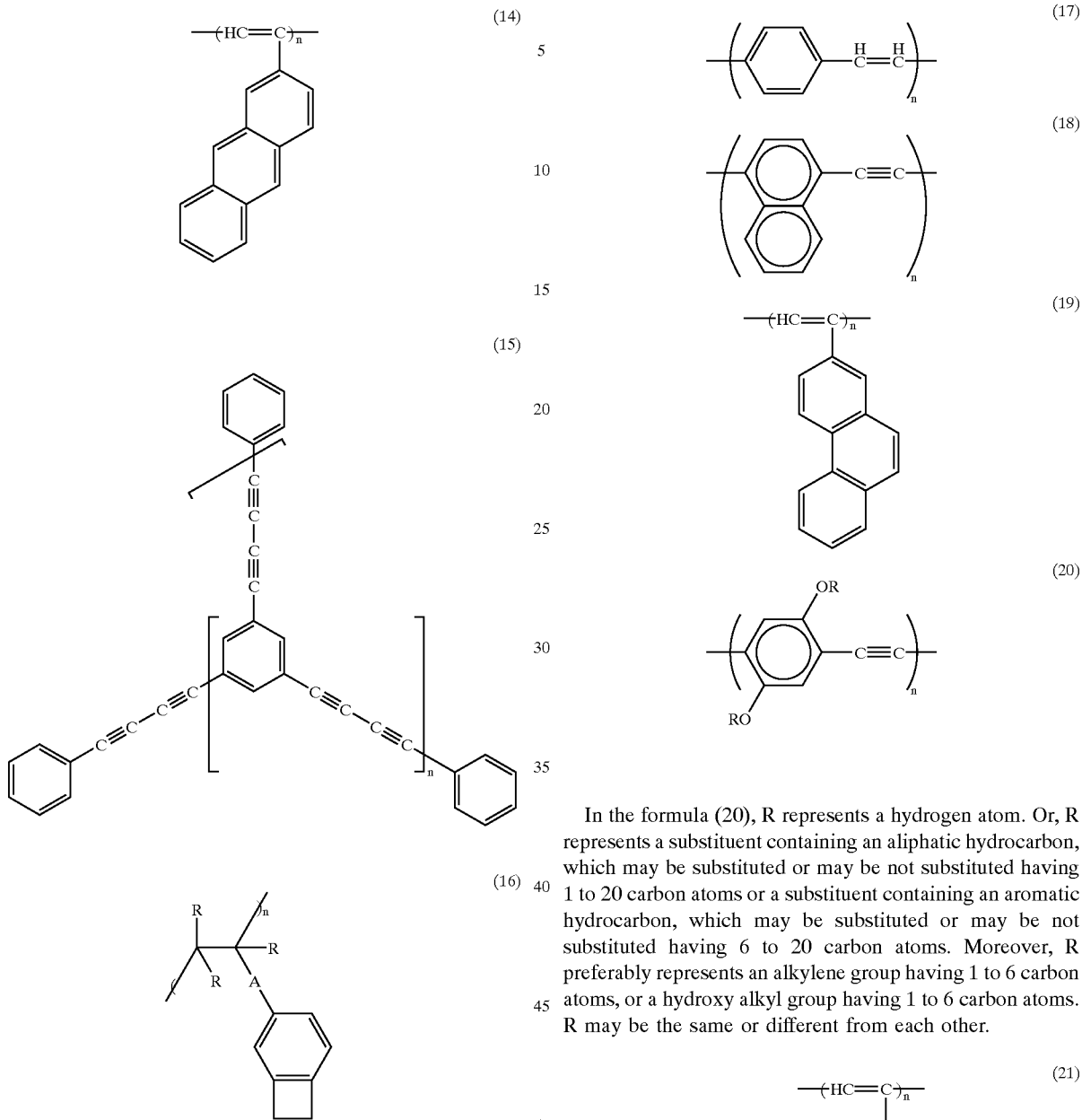

In the formula (16), R represents a hydrogen atom or a hydroxyl group. Or, R represents a substituent containing an aliphatic hydrocarbon, which may be substituted or may be not substituted having 1 to 20 carbon atoms or a substituent containing an aromatic hydrocarbon, which may be substituted or may be not substituted having 6 to 20 carbon atoms. Moreover, R preferably represents an alkylene group having 1 to 6 carbon atoms, a hydroxy alkyl group having 1 to 6 carbon atoms, or an alkoxyl group having 1 to 6 carbon atoms. R may be the same or different from each other. A represents an organic group which may be substituted or may be not substituted having 1 to 20 carbon atoms. In the formulae (11) to (16), n represents a positive integer.

In the formula (20), R represents a hydrogen atom. Or, R represents a substituent containing an aliphatic hydrocarbon, which may be substituted or may be not substituted having 1 to 20 carbon atoms or a substituent containing an aromatic hydrocarbon, which may be substituted or may be not substituted having 6 to 20 carbon atoms. Moreover, R preferably represents an alkylene group having 1 to 6 carbon atoms, or a hydroxy alkyl group having 1 to 6 carbon atoms. R may be the same or different from each other.

In the formulas (17) to (22), n represents a positive integer.

(23)

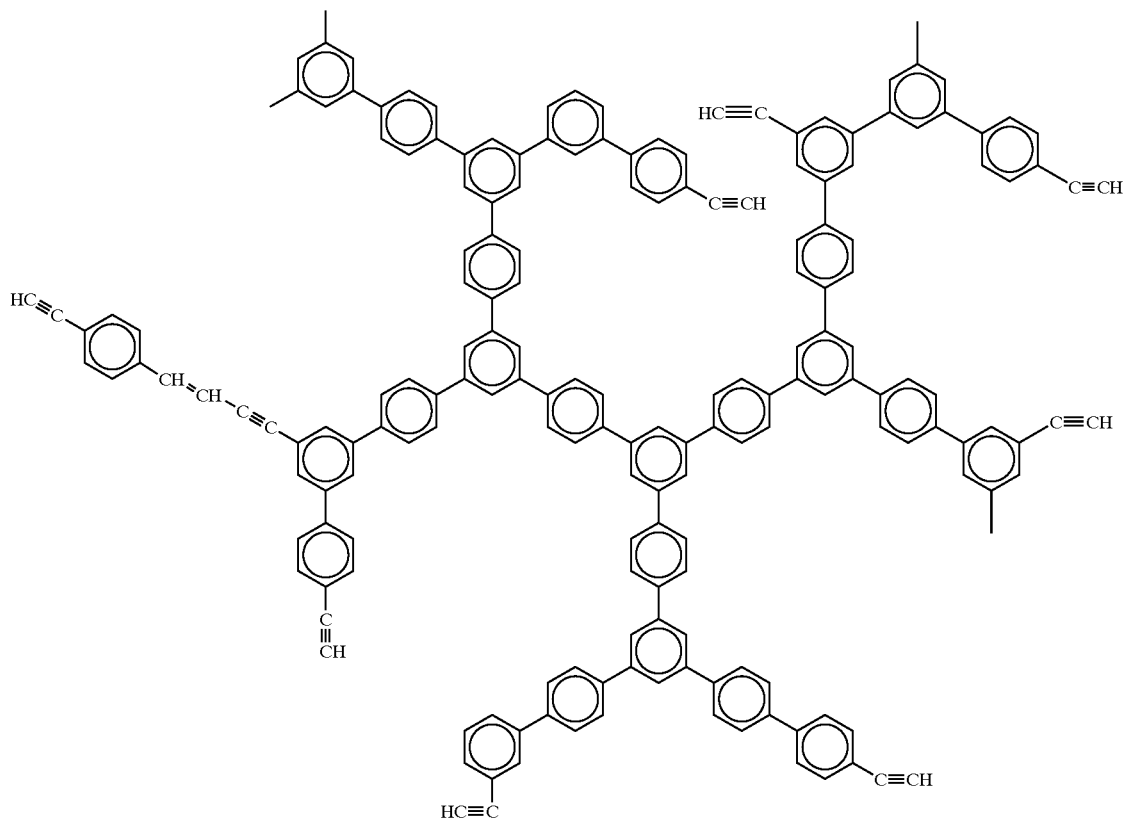

Although the average molecular weight of the aromatic compound is not restricted to any particular one, it is preferred to be 1,000 to 100,000. If the average molecular weight is less than 1,000, the compound is likely to be evaporated upon baking and if it exceeds 100,000, the compound becomes unlikely to be dissolved in solvent so that the coating film is difficult to form.

The mask material solution may be obtained by mixing two or more kinds of the aromatic compounds or mixing the aromatic compound with other compound than the aromatic compound. Further, it may be obtained by polymerizing the aromatic compound with other compound than the aromatic compound. Further, in order to ensure storage stability of the mask material solution as required, it is permissible to add heat polymerization preventing agent to the mask material solution. Further, it is permissible to add adhesion improvement agent in order to improve adhesion of the mask material solution to the object 104. Further, it is also permissible to add a conductive material, substance generating conductivity by receiving light or heat or surface-active agent in order to improve coating performance.

Although the solvent for use in the mask material solution is not restricted to any particular one, it is possible to pick up for example, ketone base solvent such as acetone, methyl ethyl ketone, methyl isobutylene ketone, and cyclohexanon; cellosolve base solvent such as methyl cellosolve, methyl cellosolve acetate, and ethyl cellosolve acetate; ester base solvent such as ethyl lactate, acetic ester, acetic butyl, and acetic isoamyl; alcohol base solvent such as methanol, ethanol, and isopropanil; anisole; toluene; xylene; naphtha; water and the like.

The mask material solution is prepared by the above-described method and the mask material solution is applied onto the object 104 by, for example, the spin coating method. Subsequently, by evaporating the mask material solution by baking, the mask material 105 is formed on the object 104. Although at this time, the baking temperature is not restricted to any particular one, it is preferred to be in a range of 100 to 500° C. If the temperature is less than 100° C., the solvent is unlikely to be dried and if it exceeds 500° C., the object 104 may be deteriorated.

After the above-described baking processing, if the weight of the mask material is assumed to be 100 wt %, the carbon content of the obtained mask member 105 is preferred to be 80 wt % or more, and more preferably 90 wt % or more. The reason is that if the carbon content is less than 80 wt %, no sufficient etching resistance can be obtained when the object 104 is processed and additionally, the side-etching upon processing the mask material 105 cannot be suppressed. In order to keep the carbon content of the mask material 105 is 80 wt % or more, the mask material solution may be prepared preliminarily so that the carbon content of the mask material solution is 80 wt % or more or the carbon content of the mask material 105 may be increased by increasing the carbon content relatively by decreasing oxygen or hydrogen by dehydrogenerating reaction or dehydrating condensation in heating processing. The polycyclic aromatic hydrocarbon starts its dehydrogenating reaction when it is baked at temperatures of 300° C. or more. A compound having a hydroxyl group starts its dehydrating condensation when it is baked at temperature of 200° C. or more.

Next, a method for forming a mask material pattern by processing the mask material 105 formed on the film 104 to be processed will be described. According to the first embodiment, the formation method of the mask material pattern is not restricted to any particular one, but methods (1) to (4) described below may be used.

(1) The intermediate layer 106 containing semiconductor element or metal element is formed on the mask material 105 as shown in FIG. 1C. For example, by dissolving any one or plural ones of compounds described in the following formulae (24) to (48) in a solvent, solution of the intermediate layer 106 is prepared. The solution is applied onto the mask material 105 using any coating method, for example, spin coating method. After that, the solution applied on the mask material 105 is baked to evaporate the solvent, thereby drying the compound. Consequently, the intermediate layer 106 is obtained on the mask material 105.

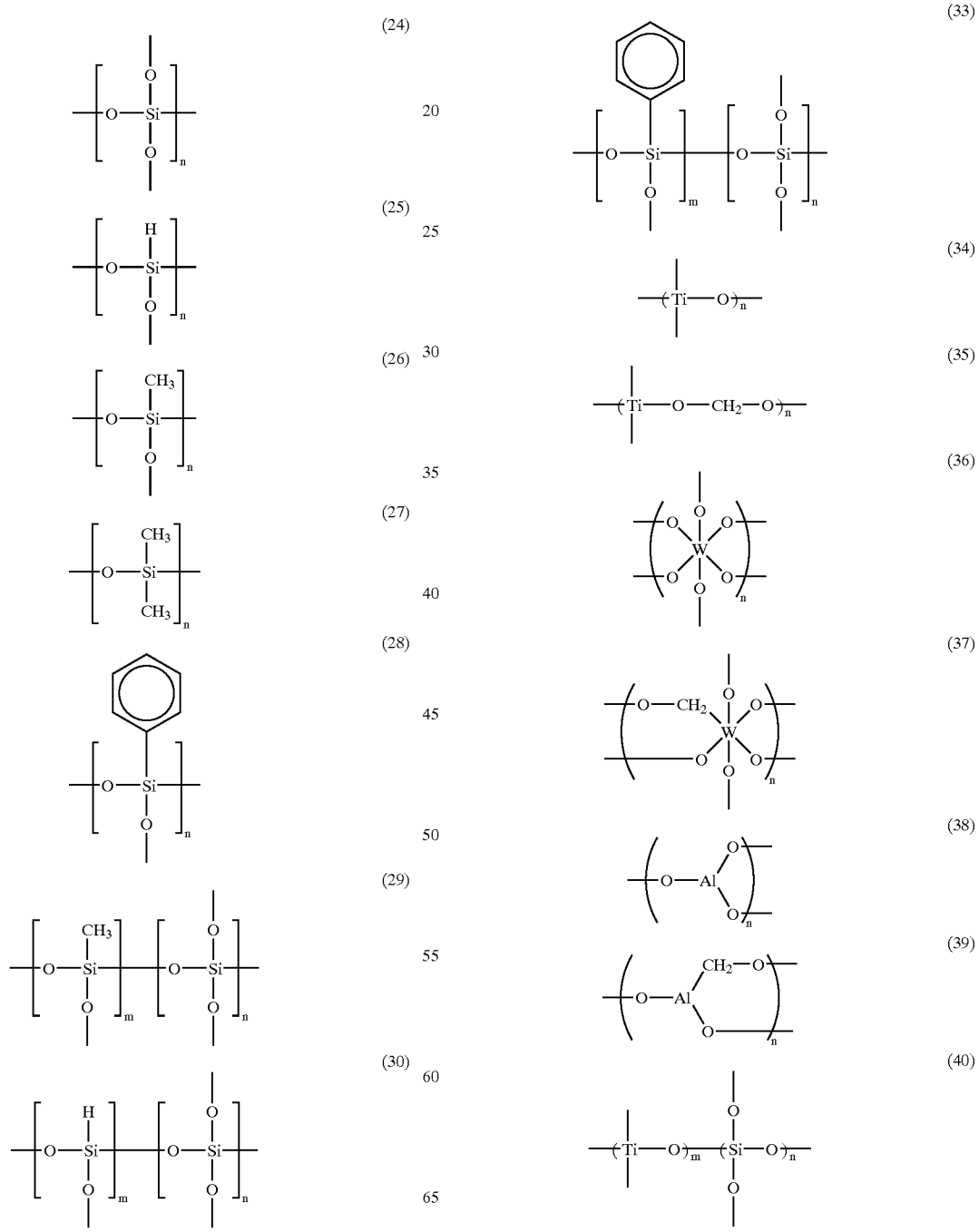

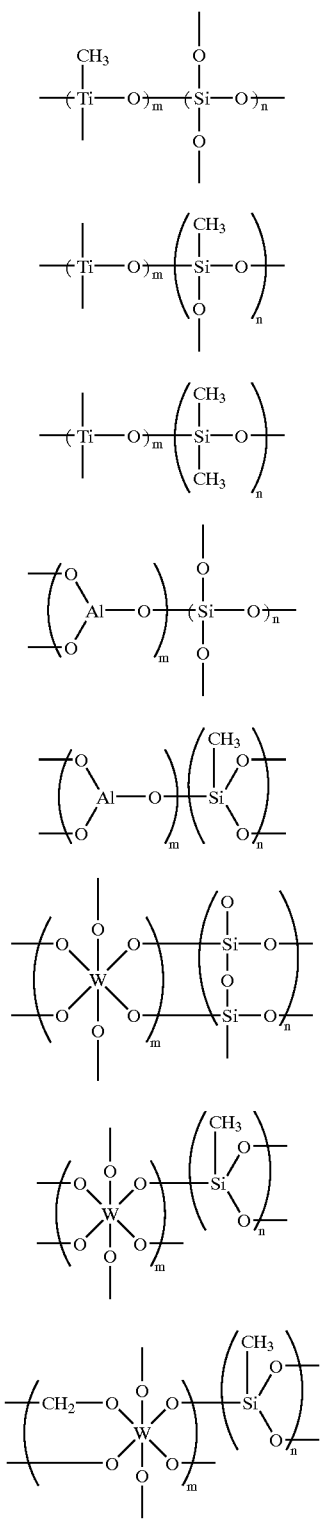

In the formulas (24) to (48), m and n represents a positive integer.

Although the film thickness of the intermediate layer 106 is not limited, it is preferred to be in a range of 10 to 1,000 nm. If the film thickness of the intermediate layer 106 is less than 10 nm, the mask material 105 is hard to be etched at a high precision. If the film thickness is larger than 1,000 nm, when the resist pattern 107 to be formed on the intermediate layer 106 is transferred to the intermediate layer 106, the intermediate layer 106 is hard to be etched at a high precision.

Although the semiconductor element contained in the intermediate layer 106 is not restricted to any particular one, for example, Si, Ge or the like can be mentioned. Further, although the metal element contained in the intermediate layer 106 is not restricted, for example, Al, W, Ti or the like can be mentioned.

Next, as shown in FIG. 1D, the photo resist film 107 is formed on the intermediate layer 106. First, resist solution for forming the photo resist film 107 is applied onto the intermediate layer 106 by, for example, spin coating method or dipping method. Next, the resist film is baked with a hot plate or oven so as to evaporate the solvent. Consequently, the photo resist film 107 is obtained on the intermediate layer 106.

The film thickness of the photo resist film 107 may be as thin as possible as long as it is capable of etching the intermediate layer 106 with an excellent dimensional controllability and preferably, it is in a range of 100 to 1,000 nm. The reason is that if the film thickness of the photo resist film 107 is reduced, the exposure amount tolerance and focus tolerance upon exposure and resolution by pattern exposure can be improved correspondingly.

The kind of resist solution used for forming the photo resist film 107 is not limited to any particular one, but it is possible to select and use a positive type or a negative type depending on the purpose. More specifically, as the positive type resist, for example, resist (IX-770, made by JSR) containing naphthoquinone diazide and novolac resin, chemically-amplified resist (APEX-E, made by Shipley) containing polyvinyl phenol resin protected by t-butoxycarbonyl (t-BOC) and onium salt and the like are possible. As the negative type resist, for example, chemically-amplified resist (SNR200, made by Shipley) containing polyvinyl phenol, melamine resin and photo acid generating agent, a resist (RD-2000N, made by Hitachi Kasei) containing polyvinyl phenol and bisazide compound and the like can be mentioned.

Next, the photo resist film 107 is exposed to light using an exposure mask in which a pattern is drawn. The exposure light for use at this time is not limit to any particular one, but for example, ultraviolet ray, X ray, electron beam, ion beam and the like can be mentioned. As the ultraviolet ray, g beam (wavelength=436 nm), i beam (wavelength=365 nm) or the like from a mercury arc lamp may be used. As another exposure light, excimer laser, such as XeF (wavelength=351 nm), XeCl (wavelength=308 nm), KrF (wavelength=248 nm), KrCl (wavelength=222 nm), ArF (wavelength=193 nm) and $F_2$ (wavelength=157 nm), may be used. The exposure mask need not be used if the electron beam or the ion beam is used.

Figure 1E:
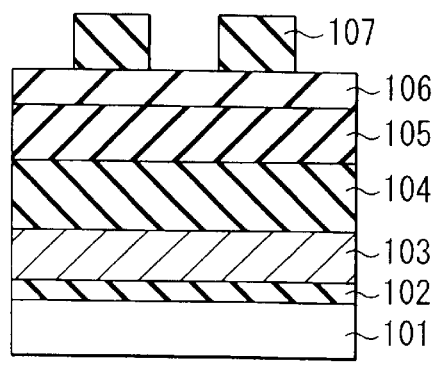

Next, the photo resist film 107 is subjected to development processing by wet development method using trimethylanmonium hydroxide (TMAH), choline and the like so as to form the resist pattern 107 as shown in FIG. 1E.

Figure 1F:
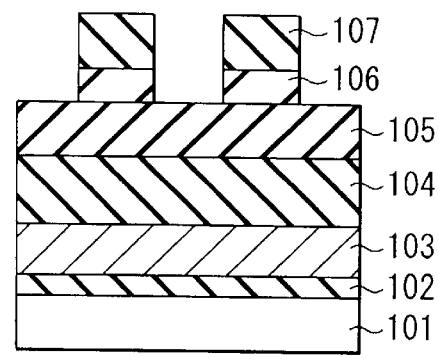

Next, by dry etching the intermediate layer 106 using the resist pattern 107 as a mask, the resist pattern 107 is transferred to the intermediate layer 106. Consequently, as shown in FIG. 1F, an intermediate pattern 106 is obtained. The etching method used for the dry etching is not restricted to any particular one if it is capable of producing fine pattern, for example, reactive ion etching, magnetron reactive ion etching, electron beam ion etching, ICP etching or ECR ion etching may be used.

Figure 1G:
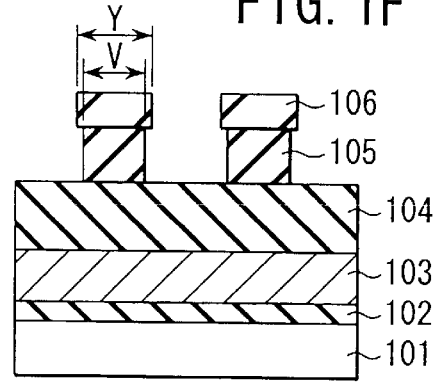

Next, the intermediate pattern 106 is transferred to the mask material 105 by etching the mask material 105 using the intermediate pattern 106 as a mask. Consequently, a mask material pattern 105 is obtained as shown in FIG. 1G. The etching method used at this time is not restricted to any particular one if it is capable of producing fine pattern, for example, reactive ion etching, magnetron reactive ion etching, electron beam ion etching, ICP etching or ECR ion etching may be used.

The mask material 105 of the first embodiment is not likely to undergo side-etching because its etching resistance to radical is high. Therefore, in processing of the mask material pattern 105, a high precision processing is assured. That is, assuming that Y is the width of the intermediate pattern 106 while V is the width of the mask material pattern 105 as shown in FIG. 1G, a difference between the width Y and the width V (side-etching value) can be kept small.

(2) As for the formation method of the mask material pattern, here, an example of using a resist pattern formed on the mask material 105 by a well known silylation method will be described.

Figure 2A:
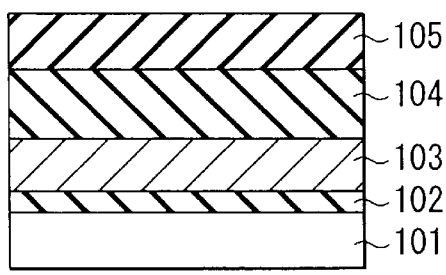
FIG. 2A to FIG. 2F are sectional views of each step showing a first example of a manufacturing method of semiconductor device according to an embodiment of the present invention.

First, as shown in FIG. 2A, the mask material 105 is formed on the silicon nitride film 104 which is the object to be processed shown in FIG. 1A.

Figure 2B:
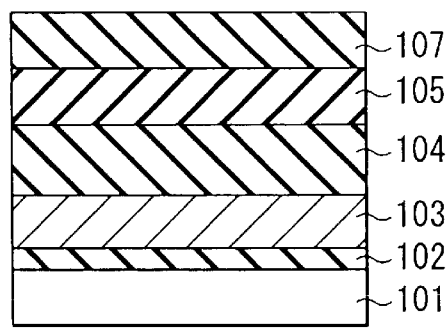

Next, as shown in FIG. 2B, the photo resist film 107 having a hydroxyl group is formed on the mask material 105. Although the photo resist film 107 is not restricted to any particular one as long as it contains a hydroxyl group, material containing polyvinyl phenol, novolac, methacrylate and acrylate may be used. Although the film thickness of the photo resist film 107 is not restricted to any particular one, preferably, it is in a range of 5 nm to 10,000 nm. If the film thickness of the photo resist film 107 is less than 5 nm, a resist pattern cannot be transferred to the mask material 105 with an excellent dimensional controllability. If the film thickness is larger than 10,000 nm, it is difficult to form a resist pattern by processing the photo resist film 107 by dry development.

Figure 2C:
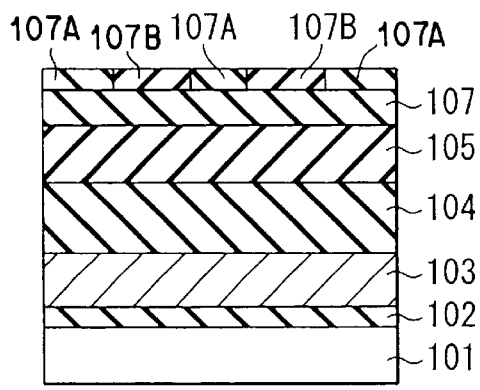

Next, pattern exposure is carried out to the photo resist film 107 using the same method as the exposure method described in the above (1) and as shown in FIG. 2C, a hydroxyl group in the exposed portion 107A is condensed. Subsequently, the photo resist film 107 is exposed to vapor containing silicon compound, for example, hexamethyldisilazane. Consequently, silicon is introduced to a portion which is not exposed to light so that a silylated portion 107B is formed.

Figure 2D:
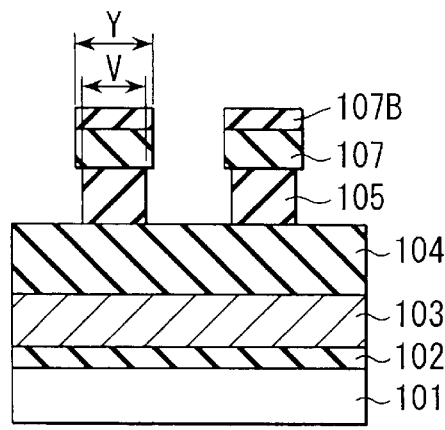

Further, by etching (dry-developing) the exposed portion 107A to which no silicon is introduced and the mask material 105, using etching gas containing oxygen with the not-exposed portion 107B to which silicon is introduced as a mask, the mask material pattern 105 shown in FIG. 2D is formed. The etching method used at this time is not restricted to any particular one as long as it is capable of producing fine pattern, for example, reactive ion etching, magnetron reactive ion etching, electron beam ion etching, ICP etching or ECR ion etching may be used.

(3) As for the formation method of the mask material pattern, here, the mask material pattern is formed by the following method.

Figure 3A:
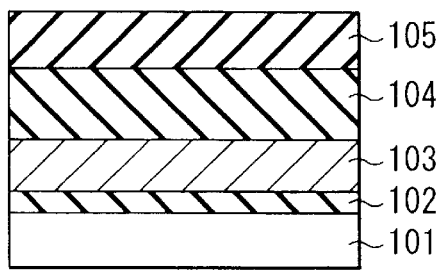
FIG. 3A to FIG. 3G are sectional views of each step showing a second example of the manufacturing method of semiconductor device according to the embodiment of the present invention.

First, as shown in FIG. 3A, the mask material 105 is formed on the object 104 which is the object to be processed shown in FIG. 1A.

Figure 3B:
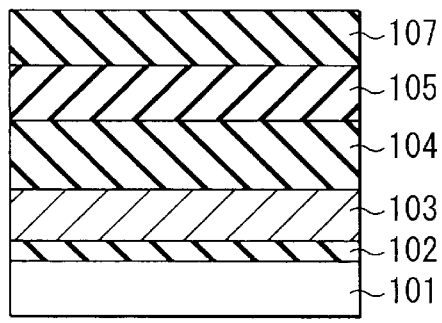
Figure 3C:
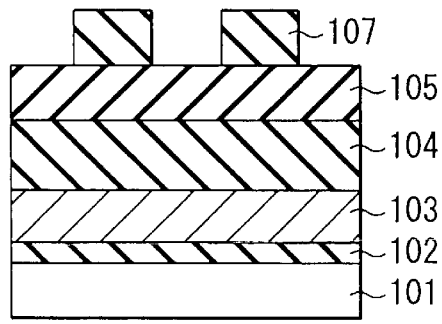

Next, as shown in FIG. 3B, the photo resist film 107 containing a hydroxyl group is formed on the mask material 105. Subsequently, pattern exposure is carried out to the photo resist film 107 using the exposure mask, so that as shown in FIG. 3C, the resist pattern 107 is formed. Although the film thickness of the photo resist film 107 is not restricted to any particular one, preferably it is in a range of 5 nm to 10,000 nm. If the film thickness of the photo resist film 107 is less than 5 nm, the resist pattern 107 cannot be transferred to the mask material 105 with an excellent controllability and if the film thickness is larger than 10,000 nm, resolution upon pattern exposure is deteriorated.

Figure 3D:
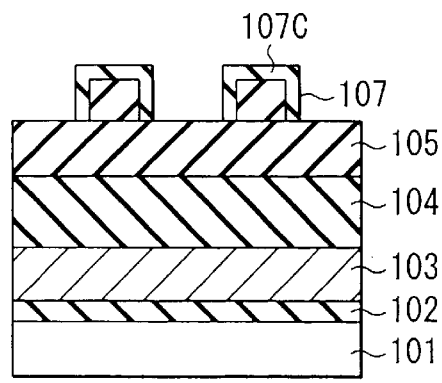

Next, a silylated portion 107C is formed in the resist pattern 107 as shown in FIG. 3D by following silylation method used ordinarily. That is, the resist pattern 107 is exposed to vapor containing silicon compound, for example, hexamethyldisilazane Consequently, silicon is introduced to the resist pattern 107, so that a silylated portion 107C is obtained in the resist pattern 107.

Figure 3E:
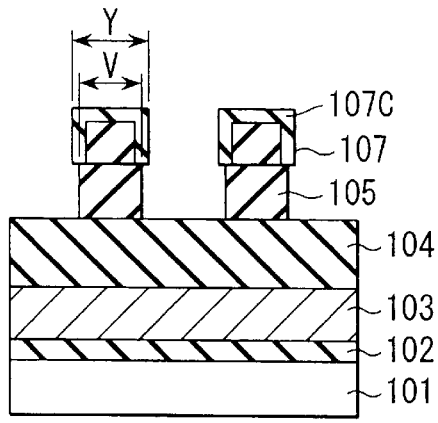

Next, using the resist pattern 107 having the silylated portion 107C as a mask, the mask material 105 is etched with etching gas preferably containing oxygen. Consequently, as shown in FIG. 3E, the resist pattern 107 is transferred to the mask material 105 so as to form the mask material pattern 105. Because silicon is introduced to the resist pattern 107, the mask material 105 can be etched while maintaining a high selectivity between the mask material 105 and the resist pattern 107. As a result, the mask material pattern 105 can be formed at a high precision. The etching method used at this time is not restricted to any particular one as long as it is capable of producing fine pattern, for example, reactive ion etching, magnetron reactive ion etching, electron beam ion etching, ICP etching or ECR ion etching may be used.

(4) As for the formation method of the mask material pattern, here, the mask material pattern is formed by the following method.

Figure 4A:
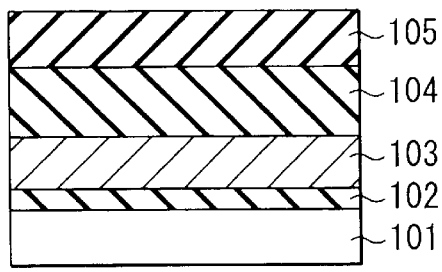
FIG. 4A to FIG. 4F are sectional views of each step showing a third example of the manufacturing method of semiconductor device according to the embodiment of the present invention.

First, as shown in FIG. 4A, the mask material 105 is formed on the object 104 which is the object to be processed shown in FIG. 1A.

Figure 4B:
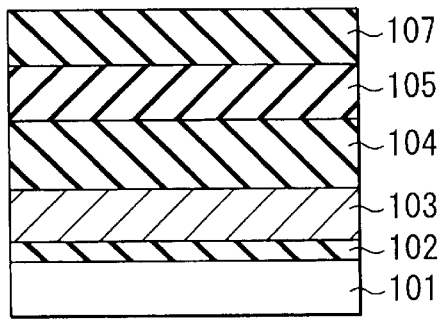

Next, as shown in FIG. 4B, the photo resist film 107 containing semiconductor element or metal element is formed on the mask material 105. The semiconductor element contained in the photo resist film 107 is, for example, silicon, germanium or the like. Further, the metal element contained in the photo resist film 107 is, for example, tungsten, aluminum, titan or the like. Although the film thickness of the photo resist film 107 is not restricted to any particular one, preferably, it is in a range of 5 nm to 10,000 nm. If the film thickness of the photo resist film 107 is less than 5 nm, the resist pattern 107 cannot be transferred to the mask material 105 with an excellent controllability and if the film thickness is larger than 10,000 nm, resolution upon pattern exposure is deteriorated. As such a resist material, a well known silicon contained resist may be used.

Figure 4C:
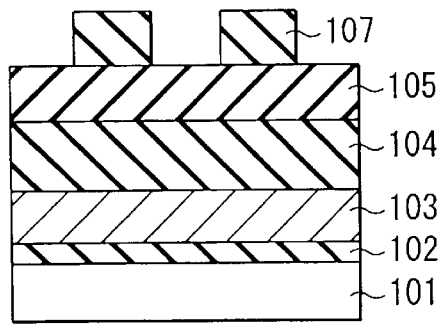

Next, pattern exposure is carried out to the photo resist film 107 using the same method as the exposure method described in the above (1). Subsequently, the resist pattern 107 is formed as shown in FIG. 4C by executing wet development processing.

Figure 4D:
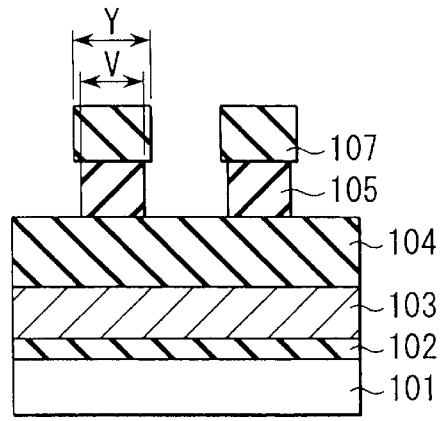

Next, using the resist pattern 107 as a mask, the mask material 105 is etched with etching gas containing at least oxygen. Consequently, as shown in FIG. 4D, the resist pattern 107 is transferred to the mask material 105 so as to form the mask material pattern 105. Because semiconductor element or metal element is introduced to the resist pattern 107, the mask material 105 can be processed while maintaining a high selectivity between the mask material 105 and the resist pattern 107. As a result, the mask material pattern 105 can be formed at a high precision.

Next, using the mask material pattern 105 formed by any one of the above-described methods (1) to (4) as a mask, the object 104 is etched. Consequently, as shown in FIG. 1H, FIG. 2E, FIG. 3F and FIG. 4E, the mask material pattern 105 is transferred to the object 104 so as to form a silicon nitride pattern 104. The etching method used at this time is not restricted to any particular one as long as it is capable of producing fine pattern, for example, reactive ion etching, magnetron reactive ion etching, electron beam ion etching, ICP etching or ECR ion etching may be used.

Because the mask material 105 of the first embodiment contains a great number of carbon atoms difficult to sputter, retraction amount of the mask material pattern 105 upon etching the object 104 is small. Thus, in patterning the object 104, the object 104 can be processed at a high precision.

After etching of the object 104 is terminated, if ordinary ashing processing is carried out with gas containing oxygen plasma, the mask material pattern 105 left on the object 104 can be ashed and removed easily.

Second Embodiment

The second embodiment will be described more in detail than the first embodiment.

According to the same method as the first embodiment, as shown in FIG. 1A, the insulating film 102, the polysilicon 103, and the silicon nitride film 104 which is the object to be processed, are formed in succession on the silicon substrate 101. Material, film thickness and manufacturing condition of respective films used here are the same as the first embodiment.

Next, using methods described in the following (S1) to (R3), the mask material 105 having the film thickness of 300 nm is formed on the silicon nitride film 104 as shown in FIG. 1B.

(S1) In the above described formula (1), $R_1$ to $R_7$, $R_9$, $R_{10}$ represent hydrogen atom, and $R_8$ represents $CH=CH_2$. By dissolving polyarylene of 10 g having average molecular weight of 12,000 in cyclohexanone of 90 g, mask material solution is prepared. The solution is applied to the silicon nitride film 104 by the spin coating method. After that, baking is carried out at 180° C. for 60 seconds and subsequently, baking is carried out at 400° C. for 60 seconds. The mask material 105 is formed on the silicon nitride film 104 by such step baking.

(S2) By dissolving aromatic compound of 10 g having the average molecular weight of 10,000 described in the formula (23) in cyclohexanone of 90 g, mask material solution is prepared. The solution is applied to the silicon nitride film 104 by the spin coating method. After that, baking is carried out at 180° C. for 60 seconds and subsequently, baking is carried out at 300° C. for 60 seconds. The mask material 105 is formed on the silicon nitride film 104 by such step baking.

(S3) In the above formula (10), $R_{21}$ to $R_{28}$ represent hydrogen atom, $R_{29}$ represents $CH_2OH$, and $R_3$ represents $CH_2$. By dissolving aromatic polycyclic compound of 10 g having average molecular weight of 10,000 in cyclohexanone of 90 g, mask material solution is prepared. The other production conditions are the same as the above (S2).

(S4) By dissolving aromatic polycyclic compound of 10 g having average molecular weight of 10,000 described in the above formula (13) in cyclohexanone of 90, mask material solution is prepared. The other production conditions are the same as the (S2).

(S5) By dissolving aromatic polycyclic compound of 10 g having average molecular weight of 10,000 described in the above formula (14) in cyclohexanone of 90, mask material solution is prepared. The other production conditions are the same as the (S2).

(R1) By dissolving polycaptonimide of 10 g having average molecular weight of 8,000 in ethyl lactate of 90 g, mask material solution is prepared. The solution is applied to the silicon nitride film 104 by the spin coating method. After that, baking is carried out at 180° C. for 60 seconds and subsequently, baking is carried out at 300° C. for 60 seconds. The mask material 105 is formed on the silicon nitride film 104 by such step baking.

(R2) The same mask material solution as the (S2) is applied to the silicon nitride film 104 by the spin coating method. After that, baking is carried out at 180° C. for 60 seconds and subsequently, step baking is carried out at 250° C. for 60 seconds. The mask material 105 is formed on the silicon nitride film 104 by such step baking.

(R3) By dissolving novolac resin of 10 g having average molecular weight of 8,000 in ethyl lactate of 90 g, mask material solution is prepared. The other production conditions are the same as the (R1). The formation method of the mask material has been described above.

Each mask material was formed on the silicon substrate by the methods (S1) to (S5) and (R1) to (R3) and a carbon content of each mask material was measured by elemental analysis method. The carbon content of each mask material is as shown in Table 1. If the carbon contents of the mask materials formed by the method (S2) and the method (R2) are compared, the carbon content of the method (S2) is higher. The reason is that the carbon content of the mask material is increased by baking the mask material solution at high temperatures. That is, the carbon content of the mask material may be increased by generating dehydrating condensation or dehydrogenerating reaction.

TABLE 1

| Sample No. | Carbon content (wt %) | Side-etching value | | |
|---|---|---|---|---|
| | | Third embodiment | Fourth embodiment | Fifth embodiment |
| (S1) | 92 | 2 | 2 | 2 |
| (S2) | 91 | 3 | 3 | 3 |
| (S3) | 90 | 3 | 3 | 3 |
| (S4) | 85 | 5 | 5 | 5 |
| (S5) | 82 | 5 | 5 | 5 |
| (R1) | 79 | 7 | 7 | 7 |
| (R2) | 77 | 7 | 7 | 7 |
| (R3) | 70 | 8 | 8 | 8 |

The elemental analysis method is executed as follows.

First, $CO_2$, $H_2O$, and $N_2$ are generated by burning an aromatic hydrocarbon compound. The $CO_2$, $H_2O$, and $N_2$ are detected by gas chromatography. Next, C (carbon) is quantified from the detected $CO_2$. Similarly, H (hydrogen) is quantified from the detected $H_2O$, and N (nitrogen) is quantified from the detected $N_2$. The quantity of O (oxygen) is identified by subtracting the quantified C, H, and N from the aromatic hydrocarbon compound, for example. Further, the element composition ratio of the aromatic hydrocarbon compound can be obtained by using X ray photoelectron spectroscopy (XPS), secondary mass ion spectrometry (SIMS), and the like.

Next, by dissolving spin-on glass of 10 g having average molecular weight of 2,000 described in the formula (26) in polyglycol mono propylether of 90 g, solution is prepared. The solution is applied to the mask material 105, so that as shown in FIG. 1C, the intermediate film 106 having a film thickness of 80 nm is formed on the mask material 105.

Next, positive type chemically amplified resist (product name: AT111S) made by JSR is applied onto the intermediate film 106 by the spin coating method. After that, the applied resist is baked at 130° C. for 80 seconds, so that as shown in FIG. 1D, the photo resist film 107 having a film thickness of 300 nm is formed on the intermediate film 106. Next, pattern exposure is carried out to the photo resist film 107 using an exposure device employing ArF excimer laser as light source and having NA of 0.68. Subsequently, the photo resist film 107 is baked at 130° C. for 80 seconds. After that, by carrying out development processing using trimethylanmonium hydroxide (TMAH) developing solution of 0.21N, the resist pattern 107 composed of line and space pattern of 110 nm is formed as shown in FIG. 1E.

Next, the intermediate film 106 is etched with etching gas containing $CF_4$ and $O_2$ by means of a reactive ion-etching device. Consequently, the resist pattern 107 is transferred to the intermediate film 106 so as to form the intermediate film pattern 106 as shown in FIG. 1F.

Figure 5:
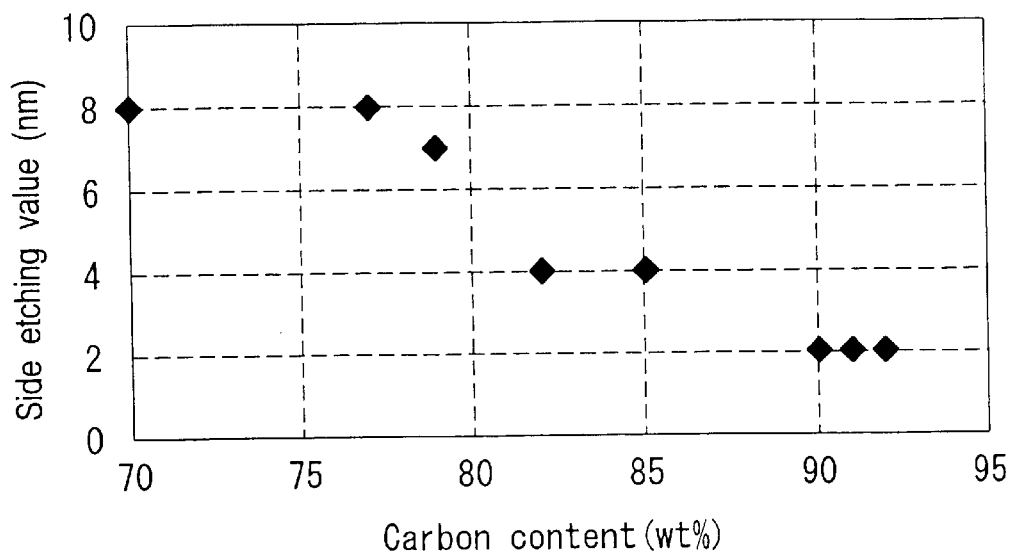
FIG. 5 is a graph indicating the relation between carbon content of a mask material pattern and side-etching value occurred in etching process of the mask material in the manufacturing method of semiconductor device according to the embodiment of the present invention.

Next, the mask material 105 is etched with etching gas containing $N_2$ and $O_2$ by means of the reactive ion-etching device. Consequently, the intermediate film pattern 106 is transferred to the mask material 105 so that the mask material pattern 105 is formed as shown in FIG. 1G. Assuming that the width of the intermediate film pattern 106 is Y and the width of the mask material pattern 105 is V as described above, the relation between the carbon content of the mask material pattern 105 and the side-etching value (Y–V) of the mask material pattern 105 is as shown in FIG. 5. According to the Figure, as the carbon content of the mask material increases, the side-etching value decreases, so that the side-etching value is its tolerance of 5 nm or less when the carbon content is 80 wt % or more. As a result, it is evident that when the carbon content of the mask material is 80 wt % or more, an effect of reducing the value of the side-etching generated upon processing the mask material pattern 105 is high. It can be considered that the higher carbon content a mask material has, the higher resistance to oxygen radical it has, thereby suppressing the side-etching value.

Figure 1H:
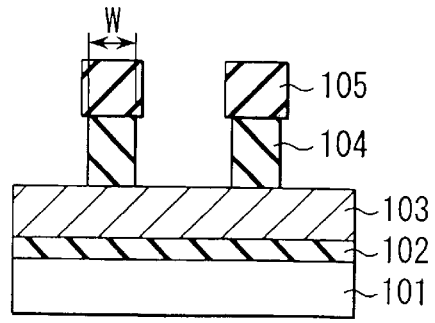

Next, the silicon nitride film 104 is etched with etching gas containing $CF_4$ and $O_2$ by means of the reactive ion etching. Consequently, the mask material pattern 105 is transferred to the silicon nitride film 104, so that a silicon nitride pattern 104 is formed as shown in FIG. 1H.

Figure 6:
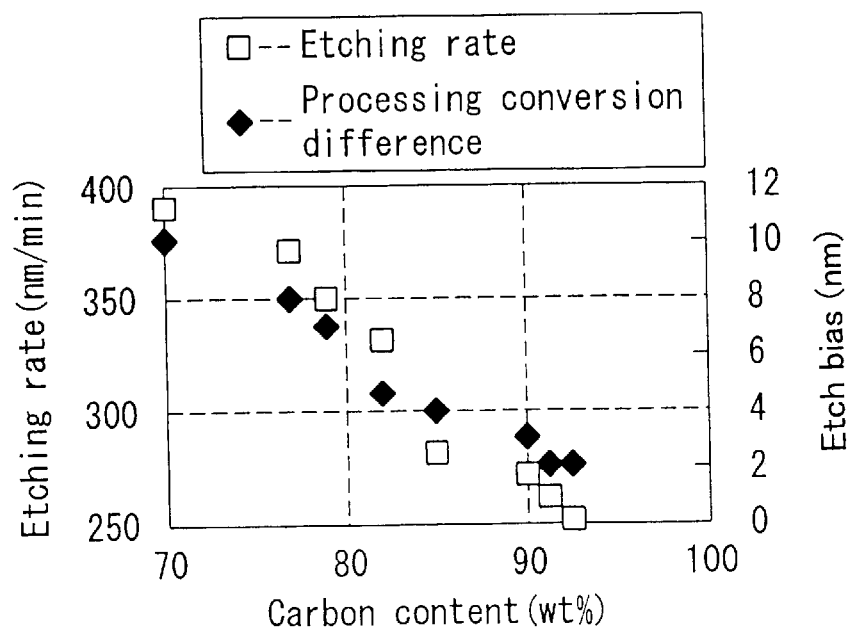
FIG. 6 is a graph indicating the relation between carbon content of a mask material pattern and etching rate of a mask material, and the relation between carbon content of the mask material pattern and an etch bias occurred in etching process of a film to be processed in the manufacturing method of semiconductor device according to the embodiment of the present invention.

Here, as described above, assume that the width of the mask material pattern 105 is V, the width of the silicon nitride pattern 104 is W and V–W is an etch bias. The relation between carbon content of the mask material pattern 105 and the etch bias, occurred in the etching process of the silicon nitride film is as shown in FIG. 6. Further, the relation between the carbon content of the mask material pattern 105 and etching rate of the mask material pattern 105 under the etching condition of the silicon nitride film is as shown in FIG. 6. As the carbon content of the mask material pattern increases, the etch bias decreases, so that the etch bias is the tolerance of 5 nm or less when the carbon content is substantially 80 wt % or more. Consequently, it is evident that when the carbon content of the mask material pattern 105 is 80 wt % or more, the effect of improving etching resistance of the mask material pattern 105 is high. Particularly when the carbon content is 90 wt % or more, the etch bias is small and the dimensional controllability is high.

After that, the mask material pattern 105 on the silicon nitride pattern 104 is ashed and removed by using an ashing device.

Figure 1I:
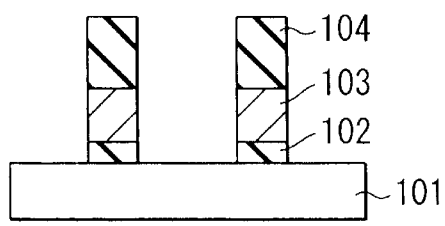

Next, the polysilicon film 103, which is a conductive material, is etched with etching gas containing at least $Cl_2$ by means of the reactive ion etching. Consequently, the silicon nitride pattern 104 is transferred to the polysilicon film 103 so as to form the polysilicon pattern 103 as shown in FIG. 1I. Because the polysilicon film 103 is processed by using the silicon nitride pattern 104 processed at a high precision as a mask in the etching process of the polysilicon film 103, the polysilicon pattern can be formed at a high precision.

Third Embodiment

In the third embodiment, a production method using the resist pattern 107 formed by the method (2) described in the first embodiment will be explained.

According to the same method as the first embodiment, as shown in FIG. 1A, the insulating film 102, the polysilicon 103, and the silicon nitride film 104 which is the object to be processed, are formed in succession on the silicon substrate 101. Material, film thickness and manufacturing condition of respective films used here are the same as the first embodiment.

Next, using the methods described in the (S1) to (R5) and (R1) to (R3) of the second embodiment, the mask material 105 having the film thickness of 300 nm is formed on the silicon nitride film 104 as shown in FIG. 2A.

Next, by dissolving polyvinyl phenol of 10 g having average molecular weight of 12,000 in ethyl lactate of 90 g, resist solution is prepared. The resist solution is applied to the mask material 105 by the spin coating method. After that, baking is carried out at 100° C. for 80 seconds, so that as shown in FIG. 2B, the photo resist film 107 having the film thickness of 100 nm is formed.

Next, pattern exposure is carried out using a exposure system employing an ArF excimer laser as light source and having NA of 0.68. Consequently, a hydroxyl group in the exposed portion 107A shown in FIG. 2C is condensed. Subsequently, the photo resist film 107 is exposed in the atmosphere of hexamethyldisilazane having vacuum degree of 10 mT. Then, by introducing silicon to s hydroxyl group in the non-exposed portion of the photo resist film 107, the silylated portion 107B is formed as shown in FIG. 2C.

The exposed portion 107A and the mask material 105 of the photo resist film are etched by the same method as the second embodiment. Consequently, the resist pattern 107B is transferred to the mask material 105 so as to form the mask material pattern as shown in FIG. 2D. The term "side-etching value" used herein means the value (Y–V), where V is the width of the mask material pattern 105 and Y is the width the resist pattern 107B has when the mask material pattern 105 is formed. Table 1 shows the side-etching values that were measured of several samples. As seen from Table 1, the side-etching value was equal to or less the upper limit of 5 nm for any mask material pattern that contained 80 wt % or more of carbon, as in the third embodiment. That is, the mask material pattern 105 can be processed with a small side-etching value.

Figure 2E:
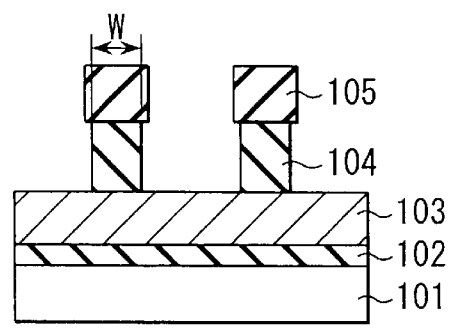

Next, the silicon nitride film 104 is etched by the same method as the second embodiment, so that the silicon nitride pattern 104 is formed as shown in FIG. 2E. The term "etch bias" used herein means the value (V–W), where W is the width of the silicon nitride pattern 104 and V is the width of the mask material pattern 105. The etch bias was equal to or less the upper limit of 5 nm for any mask material pattern that contained 80 wt % or more of carbon, as in the third embodiment. Thus, the silicon nitride pattern 104 is processed with high precision.

Figure 2F:
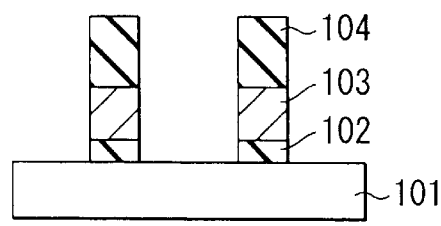

Further, the polysilicon film 103 is etched by the same method as the second embodiment, so as to form the polysilicon pattern 103 as shown in FIG. 2F. The silicon nitride pattern 104 processed with high precision is used as a mask in the step of etching the polysilicon film 103. Hence, the polysilicon pattern 103 can be pattern with high precision.

Fourth Embodiment

In the fourth embodiment, a production method using the resist pattern 107 formed by the method (3) described in the first embodiment will be explained.

According to the same method as the first embodiment, as shown in FIG. 1A, the insulating film 102, the polysilicon 103, and the silicon nitride film 104 which is the object to be processed, are formed in succession on the silicon substrate 101. Material, film thickness and manufacturing condition of respective films used here are the same as the first embodiment.

Next, using the methods described in the (S1) to (R5) and (R1) to (R3) of the second embodiment, the mask material 105 having the film thickness of 300 nm is formed on the silicon nitride film 104 as shown in FIG. 3A.

Next, positive type chemically amplified resist (product name: AT111S) made by JSR is applied to the mask material 105 by the spin coating method. After that, baking is carried out at 100° C. for 80 seconds, so that as shown in FIG. 3B, the photo resist film 107 having the film thickness of 100 nm is formed.

Next, pattern exposure is carried out using an exposure device employing ArF excimer laser as light source and having NA of 0.68 and baking is carried out at 100° C. for 80 seconds. After that, development processing is carried out using trimethylanmonium hydroxide (TMAH) developing solution of 0.21N. Consequently, the resist pattern 107 composed of line and space pattern of 110 nm is formed as shown in FIG. 3C.

Next, the resist pattern 107 is exposed in the atmosphere of hexamethyldisilazane of vacuum degree of 10 mT. Consequently, by introducing silicon into a hydroxyl group in the resist pattern 107, the silylated portion 107C is formed as shown in FIG. 3D.

Next, by etching the mask material 105 according to the same method as the second embodiment, the resist pattern 107C is transferred to the mask material so as to form the mask material pattern 105 as shown in FIG. 3E. The term "side-etching value" used herein means the value (Y–V), where V is the width of the mask material pattern 105 and Y is the width of the resist pattern 107C has when the mask material pattern 105 is formed. Table 1 shows the side-etching values that were measured of several samples. As seen from Table 1, the side-etching value was equal to or less the upper limit of 5 nm for any mask material pattern that contained 80 wt % or more of carbon, as in the fourth embodiment. That is, the mask material pattern 105 can be processed with a small side-etching value.

Figure 3F:
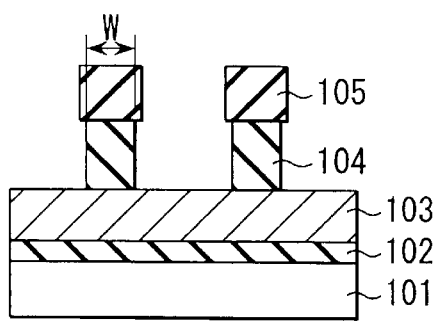

Next, by etching the silicon nitride film 104 according to the same method as the second embodiment, the silicon nitride pattern 104 is formed as shown in FIG. 3F. The term "etch bias" used herein means the value (V–W), where W is the width of the silicon nitride pattern 104 and V is the width of the mask material pattern 105. The etch bias was equal to or less the upper limit of 5 nm for any mask material pattern that contained 80 wt % or more of carbon, as in the fourth embodiment. Thus, the silicon nitride pattern 104 is processed with high precision.

Figure 3G:
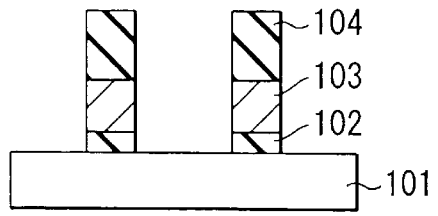

Further, by etching the polysilicon film 103 according to the same method as the second embodiment, the polysilicon pattern 103 is formed as shown in FIG. 3G. The silicon nitride pattern 104 processed with high precision is used as a mask in the step of etching the polysilicon film 103. Hence, the polysilicon pattern 103 can be pattern with high precision.

Fifth Embodiment

In the fifth embodiment, a production method using the resist pattern 107 formed by the method (4) described in the first embodiment will be explained.

According to the same method as the first embodiment, as shown in FIG. 1A, the insulating film 102, the polysilicon 103, and the silicon nitride film 104 which is the object to be processed, are formed in succession on the silicon substrate 101. Material, film thickness and manufacturing condition of respective films used here are the same as the first embodiment.

Next, using the methods described in the (S1) to (R5) and (R1) to (R3) of the second embodiment, the mask material 105 having the film thickness of 300 nm is formed on the silicon nitride film 104 as shown in FIG. 4A.

Next, by dissolving inhibitor resin of 9 g having average molecular weight of 12,000 containing silicon described in the formula (49) and sulfoneimide of 1 g as acid generating agent into ethyl lactate of 80 g, solution is prepared. The solution is applied to the mask material by the spin coating method. After that, baking is carried out at 100° C. for 80 seconds, so that as shown in FIG. 4B, the photo resist film 107 containing silicon having a film thickness of 100 nm is formed.

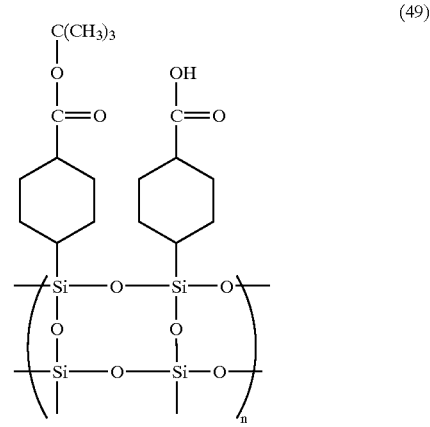

(49)

In the formula (49), n represents a positive integer.

Next, pattern exposure is carried out using an exposure device employing ArF excimer laser as light source and having NA of 0.68 and baking is carried out at 100° C. for 80 seconds. After that, development processing is carried out using trimethylanmonium hydroxide (TMAH) developing solution of 0.21N. Consequently, the resist pattern 107 composed of line and space pattern of 110 nm is formed as shown in FIG. 4C.

Next, by etching the mask material 105 according to the same method as the second embodiment, the resist pattern 107 is transferred to the mask material 105, so that the mask material pattern 105 is formed as shown in FIG. 4D. The term "side-etching value" used herein means the value (Y–V), where V is the width of the mask material pattern 105 and Y is the width the resist pattern 107 has when the mask material pattern 105 is formed. Table 1 shows the side-etching values that were measured of several samples. As seen from Table 1, the side-etching value was equal to or less the upper limit of 5 nm for any mask material pattern that contained 80 wt % or more of carbon, as in the fifth embodiment. That is, the mask material pattern 105 can be etched with a small side-etching value.

Figure 4E:
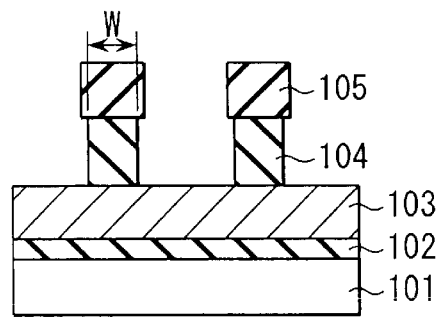

Then, the silicon nitride film 104 is etched by the same method as the second embodiment so as to form the silicon nitride pattern 104 as shown in FIG. 4E. The term "etch bias" used herein means the value (V–W), where W is the width of the silicon nitride pattern 104 and V is the width of the mask material pattern 105. The etch bias was equal to or less the upper limit of 5 nm for any mask material pattern that contained 80 wt % or more of carbon, as in the fifth embodiment. Thus, the silicon nitride pattern 104 is processed with high precision.

Figure 4F:
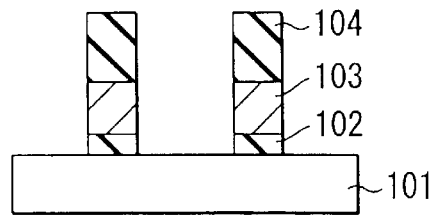

Further, by etching the polysilicon film 103 according to the same method as the second embodiment, the polysilicon pattern 103 is formed as shown in FIG. 4F. The silicon nitride pattern 104 processed with high precision is used as a mask in the step of etching the polysilicon film 103. Hence, the polysilicon pattern 103 can be pattern with high precision.

Sixth Embodiment

In the sixth embodiment, a method in which a pattern is formed with a multi-layered film and a semiconductor device having the multi-layered wiring structure is produced with the pattern as a mask will be described. To accelerate the speed of the semiconductor device, a low-resistance metal wiring having a low electric resistance and a interlayer insulating film having a low relative dielectric constant are disposed at each predetermined position so as to form a multi-layered wiring structure.

FIG. 7A to FIG. 7F are sectional views of each process indicating a manufacturing method of semiconductor device according to the sixth embodiment. Meanwhile, FIG. 7A to FIG. 7F show sectional views perpendicular to the longitudinal direction of the pattern.

First, an insulating film 202 is formed on a silicon substrate 201. A first metal wiring layer 204 is formed in the insulating film 202 with a barrier film 203 therebetween. The metal wiring layer 204 is formed of a low-resistance wiring material such as copper (Cu) wiring, aluminum (Al) wiring, aluminum alloy wiring and the like.

After that, a interlayer insulating film 206 is formed in the thickness of about 800 nm with a barrier film 205 therebetween the insulating film 202 and the metal wiring layer 204. Here, as the barrier film 205, silicon nitrided film formed by, for example, well known plasma CVD method or the like is employed. As the interlayer insulating film 206, an insulating film having a low relative dielectric constant of 3.9 or less is used. The insulating film of low relative dielectric constant is, for example, an insulating film containing organic component (carbon hydride (CH) or the like) such as organic silicon oxide film. The interlayer insulating film 206, that is, organic silicon oxide film or the like is formed by direct coating while rotating the silicon substrate 201 according to a well-known coating method such as spin coating method.

After that, an organic base film 207, an organic silicon oxide film 208 and a photo resist film 209 are formed on the interlayer insulating film 206 in layers successively by a coating method so that multi-layered structure including three layers is formed. By processing each layer of the multi-layered film successively, each pattern is transferred, so that a mask pattern having a predetermined shape and dimensions is formed on a film to be processed.

Hereinafter, a formation method for forming respective films composing the multi-layered structure will be described in detail.

First, the organic base film 207 is formed in the thickness of about 500 nm on the interlayer insulating film 206 as lower layer film. The organic base film 207 has aromatic ring and the carbon (atom) content thereof is 80 wt % or more, preferably 90 wt % or more. The organic base film 207 is hard film having a high etching resistance. As an example of the organic base film 207, here, a film having carbon (atom) content of 93 wt % is formed by a well known coating method. The film having such composition may be formed in following processes. First, by dissolving a compound containing carbon (C) in predetermined solvent, for example organic solvent, coating solution is prepared. The coating solution is applied to the interlayer insulating film 206 while rotating the silicon substrate 201 by a well known coating method such as spin coating method. After that, this applied film is heat-treated and baked at a predetermined temperature. Consequently, the organic base film 207 is formed in the thickness of about 500 nm on the interlayer insulating film 206.

To form coating solution for the organic base film 207 which is a lower layer film, the following materials are used. As compound containing carbon (C), for example, polyarylene, polyarylene ether, phenol resin, phenol novolac, aromatic polycyclic resin and the like are employed. Not only these are employed as a single body, but also it is permissible to mix several kinds thereof. That is, any compound containing the aromatic ring may be dissolved into a predetermined solvent so as to form organic base film whose carbon (atom) content is 90 wt % or more (less than 100 wt %), easily. According to an example of the embodiment, aromatic polycyclic resin is used as a compound containing carbon. Then, the carbon (atom) content is set up in a range of 90 to 95 wt %, as an example, 93 wt %.

As the predetermined solvent, that is, organic base solvent, ketone base solvent such as acetone and methyl ethyl ketone; cellosolve base solvent such as methyl cellosolve and methyl cellosolve acetate; ester base solvent such as ethyl lactate and acetic ester; alcohol base solvent such as methanol and ethanol; anisole; toluene; and the like are employed.

To increase the carbon (atom) content in the organic base film 207 and form that film by a coating method, the carbon (atom) content needs to be high and it is necessary to dissolve polymeric compound (hereinafter referred to as carbon base polymeric material) in solvent. For the purpose, it is effective to add oxygen (O), hydrogen (H) or nitrogen (N) single body or a compound containing those to carbon base polymeric material as a modified group. By making the organic base solvent and carbon base polymeric material having a high carbon (atom) content react with each other using this modified group as an agency, coating solution may be formed. Here, the molecular weight of the carbon base polymeric material is adjusted so as to be soluble in organic base solvent to form coating solution. After that, if the coating solution is heat-treated at a predetermined temperature, part of the solvent is evaporated and molecules of the carbon base polymeric material are chemically bonded due to heat cross-linking type reaction. Consequently, the organic base film 207 whose carbon (atom) content is 90 wt % or more (less than 100 wt %) can be formed. The organic base film formed in this way has a higher hardness than ordinary photo resist film and the etching resistance is high.

Next, the organic silicon oxide film 208 is formed in the thickness of about 90 nm on the organic base film 207, which is a lower layer film, as an intermediate layer. The organic silicon oxide film 208 is a kind of well known SOG film formed by the coating method.

Generally, when forming a mask pattern with the multi-layered film composed of three layers, the well known SOG film should be used as the intermediate film. The intermediate film is desired to be as thin as possible so that a pattern of a predetermined shape and dimensions is formed by dry etching technology. The SOG film is a silicon oxide film formed by the coating method. Because the SOG film is applied directly to a rotating silicon substrate using centrifugal force, its surface is flat and it is likely to be formed in thin film. Therefore, if the SOG film is used as the intermediate film in case of forming a mask pattern using the multi-layered film composed of three layers, a thin film can be formed easily considering thicknesses of the upper layer film and lower layer film and etching selecting ratio between the upper layer film and lower layer film (difference of etching values per unit time).

According to the embodiment, the intermediate film is not restricted to any particular one as long as it has an etching resistance to oxygen plasma which etches the lower layer film or the organic base film 207 and contains nonvolatile component. As material of the intermediate film, for example, organic silicon oxide film which is oxide containing organic component, silicon oxide film ($SiO_2$) which is oxide containing an inorganic component and the like can be used.

Therefore, according to the embodiment, as an example of the intermediate film, an organic silicon oxide film, which is a kind of the well known SOG film, is employed. Here, the organic silicon oxide film 208 is formed in the thickness of about 90 nm as the intermediate film, based on the thicknesses of the photo resist film (upper layer film) 209 and the organic base film (lower layer film) 207.

Meanwhile, as the intermediate film, not only the silicon oxide film, but also film containing silicon as its main component may be used. In this case, a film composed of mainly silicon should be formed on the organic base film 207 by a well known coating method such as spin coating method. For example, solution containing silicon is applied to the organic base film 207 on the rotating silicon substrate 201 in the form of a film. After that, it is heat-treated and baked at a predetermined temperature. Consequently, film composed of mainly silicon is formed on the organic base film 207 as the intermediate film.

After that, photo-sensitive positive type photo resist is applied to the organic silicon oxide film 208 by well known method such as the spin coating method. Subsequently, the photo resist applied on the organic silicon oxide film 208 is heat-treated and baked at 200 to 300° C. Consequently, the organic base film, which is the upper layer film, for example the positive photo resist film 209 is formed on the organic silicon oxide film 208 in the thickness of about 300 nm.

As a result, the multi-layered film composed of three layers is formed on the interlayer insulating film 206, which is a object to be processed, the multi-layered film comprising the organic base film (lower layer film) 207, the organic silicon oxide film (intermediate film) 208 and the photo resist film (upper layer film) 209.

Next, the multi-layered film is processed to a mask pattern having a predetermined shape and dimensions using lithography technology and dry etching technology by the following method.

Figure 7A:
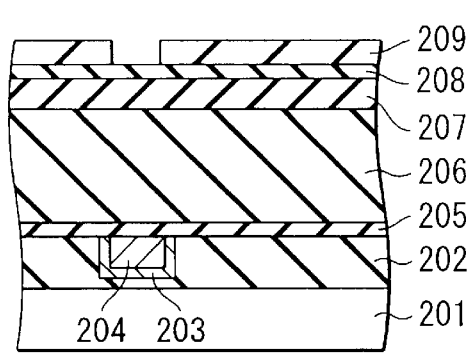
FIG. 7A to FIG. 7F are sectional views of each step showing a manufacturing method of semiconductor device according to another embodiment of the present invention.
Figure 7D:
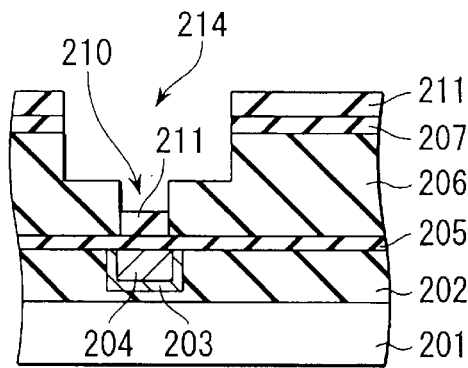

First, as shown in FIG. 7A, a positive photo resist film 209 is subjected to exposure process and development process using lithography technology so as to form a pattern in the photo resist film 209. Here, exposure light is irradiated to the photo resist film 209 through an exposure mask (reticle) in which a pattern of wiring, via hole (contact hole) and the like are drawn. After that, an unnecessary portion of the photo resist film 209 is removed using development solution. Consequently, a pattern having a predetermined shape and dimensions is formed in the photo resist film 209.

Figure 7B:
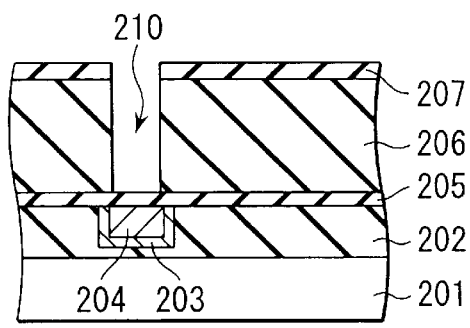

Next, with the pattern formed in the photo resist film 209 as a mask, the pattern is transferred to the organic silicon oxide film 208 and the organic base film 207 in order according to dry etching technology. After that, with a pattern formed in the organic base film 207 as a main mask, a via hole 210 is formed in the interlayer insulating film 206 as shown in FIG. 7B.

A method for forming a pattern acting as a mask in the organic base film 207 and a method for forming the via hole 210 in the interlayer insulating film 206 will be described in detail.

First, with the pattern formed in the photo resist film 209 as a mask, that pattern is transferred to the organic silicon oxide film 208 using dry etching technology. Here, with a pattern formed in the photo resist film 209 as a mask, a pattern following the shape and dimensions of the pattern in the photo resist film 209 is formed in the organic silicon oxide film 208. As the dry etching technology, a RIE method suitable for fine processing is employed and a pattern is formed in the organic silicon oxide film 208 in a reaction chamber of a reactive ion etching device set up to a predetermined condition. As the etching gas, mixture gas containing $CF_4$, oxygen ($O_2$) and argon (Ar) is employed.

After that, with the patterns in the photo resist film 209 and the organic silicon oxide film 208 as a mask, the pattern is transferred to the organic base film 207 which is a lower layer by dry etching technology. Here, with the patterns formed in the photo resist film 209 and the organic silicon oxide film 208 as a mask, a pattern following the shape and dimensions of these patterns is formed in the organic base film 207. The RIE method suitable for fine processing is employed in the dry etching technology and a pattern is formed in the organic base film 207 in a reaction chamber of the reactive ion etching device set to a predetermined condition. As the etching gas, mixture gas of oxygen ($O_2$) and nitrogen gas ($N_2$) are used.

Because the photo resist film 209 is formed of substantially the same material as the organic base film 207, it disappears in an etching process for forming the pattern in the organic base film 207. Therefore, the interlayer insulating film 206 is processed by etching with the patterns in the organic silicon oxide film 208 and the organic base film 207 as a mask.

After that, with the patterns in the organic base film 207 and the organic silicon oxide film 208 as a mask, the via hole 210 having a predetermined opening diameter is formed in the interlayer insulating film 206 so as to have a depth of about 0.8 μm as shown in FIG. 7B such that it arrives at the barrier film 205. The organic silicon oxide film 208 vanishes in etching process of the interlayer insulating film 206 and after that, the pattern in the organic base film 207 acts as a main mask so as to form the via hole 210 in the interlayer insulating film 206 which is the object to be processed.

The dry etching technology is employed to form the via hole 210. As the dry etching technology, the RIE method suitable for fine processing is employed. The via hole 210 is formed in the interlayer insulating film 206 in the reaction chamber of the reactive ion etching device set up to a predetermined condition. As the etching gas, mixture gas containing $C_4F_8$ and argon (Ar) is used.

The barrier film 205 acts as so-called etching stopper film in a process of forming the via hole 210. Therefore, etching on the interlayer insulating film 206 is stopped temporarily soon after it arrives at the barrier film 205. Thus, it never damages the surface of the metal wiring layer 204, which is the first layer.

Next, the pattern of the organic base film 207 is coated with an organic base film 211 whose carbon (atom) content is 90 to 95 wt % made of the same material so that the via hole 210 is filled therewith. After that, the applied film is heat-treated and baked at about 300° C. Consequently, the organic base film 211 is formed on the organic base film 207 and so that the via hole 210 is filled therewith.

Here, as an example, the carbon (atom) content of the organic base film 211 is assumed to be 93 wt %. The film having such composition may be formed in the following way. Like for the organic base film 207, coating solution is prepared by dissolving a compound containing carbon (c) in a predetermined solvent, for example organic base solvent. Then, the organic base film 211 is formed by applying the coating solution directly onto a rotating silicon substrate 201 by the spin coating method or the like. Because the coating solution is applied to the organic base film 211 having a structure shown in FIG. 7B, the via hole 210 can be filled therewith easily. Further, because it is formed by using centrifugal force, the surface of the organic base film 211 is formed in a flat condition. The organic base films 207, 211 each having the same composition fit well to each other, so that both are baked together by heat treatment. Thus, while a pattern is formed by etching in a subsequent process, a stabilized layered structure can be maintained.

Meanwhile, the organic base film 211 may be formed on the object to be processed by the same method as, by using the same material as mentioned about the formation process of the organic base film 207, as a compound and organic base solvent containing carbon (C).

Next, an organic silicon oxide film 212 and an organic base, photo-sensitive positive photo resist film 213 are formed on the organic base film 211 in succession by a well known coating method such as the spin coating method and again, the multi-layered film composed of three layers is formed.

Figure 7E:
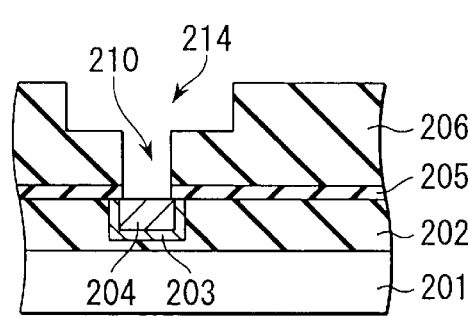
Figure 7C:
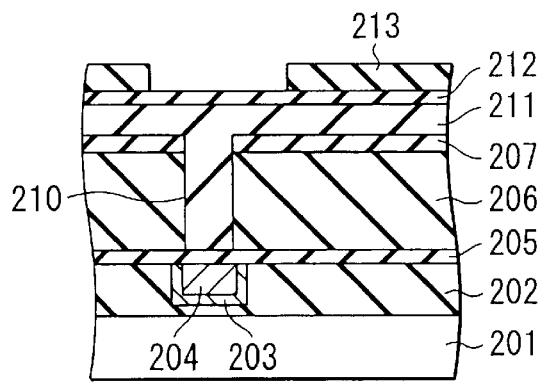

After that, as shown in FIG. 7C, a pattern is formed in the photo resist film 213 by lithography technology. Here, exposure light is irradiated to the photo resist film 213 through an exposure mask (reticle) in which a wiring pattern is drawn. After that, an unnecessary portion of the photo resist film 213 is removed using development solution. Consequently, a pattern having a predetermined shape and dimensions is formed in the photo resist film 213.

Next, with the pattern formed in the photo resist film 213 as a mask, the pattern is transferred to the organic silicon oxide films 212 and the organic base films 207, 211 in order according to dry etching technology. After that, with a pattern formed in the organic base films 207, 211 as a main mask, a wiring groove 214 having a predetermined depth and width is formed in the interlayer insulating film 206.

A method for forming a pattern acting as a mask in the organic base films 207, 211 and a method for forming the wiring groove 214 in the interlayer insulating film 206 will be described in detail.

First, with the pattern formed in the photo resist film 213 as a mask, that pattern is transferred to the organic silicon oxide film 212 using dry etching technology. Here, with a pattern formed in the photo resist film 213 as a mask, a pattern following the shape and dimensions of the pattern in the photo resist film 213 is formed in the organic silicon oxide film 212. As the dry etching technology, the RIE method suitable for fine processing is employed and a pattern is formed in the organic silicon oxide film 212 in the reaction chamber of the reactive ion etching device set up to a predetermined condition. As the etching gas, mixture gas containing $CF_4$, oxygen ($O_2$) and argon (Ar) is employed.

After that, with the patterns in the photo resist film 213 and the organic silicon oxide film 212 as a mask, the pattern is transferred to the organic base films 207, 211 which are lower layers by dry etching technology. Here, with the patterns formed in the photo resist film 213 and the organic silicon oxide film 212 as a mask, a pattern following the shape and dimensions of these patterns is formed in the organic base films 207, 211. The RIE method suitable for fine processing is employed in the dry etching technology and a pattern is formed in the organic base films 207, 211 in the reaction chamber of the reactive ion etching device set to a predetermined condition. As the etching gas, mixture gas of oxygen ($O_2$) and nitrogen ($N_2$) are used.

Because the photo resist film 213 is formed of substantially the same material as the organic base films 211, 207, it disappears in an etching process for forming the pattern in the organic base films 211, 207. Thus, with a layered pattern in the organic silicon oxide film 212 and the organic base films 211, 207 as a mask, the wiring groove 214 is formed in the interlayer insulating film 206 by the dry etching technology. Here, the organic silicon oxide film 212 vanishes in a process of etching the interlayer insulating film 206. After that, the layered pattern in the organic base films 207, 211 act as a main mask, so that the wiring groove 214 is formed in the interlayer insulating film 206 which is the object to be processed.

Different from a case in which a conventional photo resist film (carbon (atom) content is about 70 wt %) is used, the organic base film 207 and 211, which is the lower layer film, has a high etching resistance and each mask pattern is maintained in a substantially constant thickness even after the etching processing based on the RIE method is carried out.

The organic base film 211 is formed by the coating method using centrifugal force as described above and fits well to the organic base film 207 having the same composition. Therefore, the surface of the organic base film 211 is formed substantially flat. Thus, even if the organic silicon oxide film 212, which is an intermediate film and the photo resist film 213, which is an upper layer film, are formed on the organic base film 211 in layers in succession, flatness of the surface of the multi-layered film can be maintained. Thus, the mask pattern and wiring groove can be formed at an excellent precision successively.

Here, as the dry etching technology used for forming the wiring groove 214, the RIE method suitable for fine processing is employed. The wiring groove 214 is formed in the interlayer insulating film 206 in the reaction chamber of the reactive ion-etching device set to a predetermined condition. At this time, as the etching gas, mixture gas containing $CF_4$, oxygen ($O_2$) and argon (Ar) are used.

Next the organic base films 207, 211 left on the interlayer insulating film 206 and within the via hole 210 are removed by the RIE method using gas containing oxygen ($O_2$). After that, the barrier film 205 is partially removed by dry etching technology such as RIE method. As shown in FIG. 7E, the surface of the metal wiring layer 204 which is the first layer is exposed within the via hole 210.

Figure 7F:
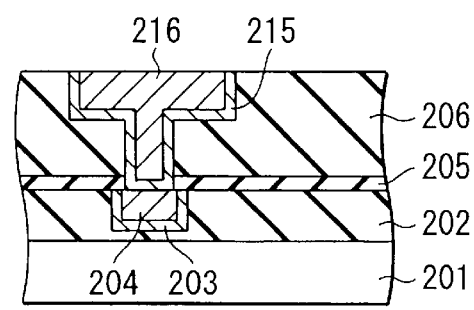

Next, as shown in FIG. 7F, the barrier film 215 is formed on inner walls of the via hole 210 and the wiring groove 214. Then, a wiring material is embedded in the via hole 210 and the wiring groove 214 through the barrier film 215. A so-called dual damascene wiring structure is formed by forming the metal wiring layer 216 which is the second layer so as to be electrically connected to the metal wiring layer 204 which is the first layer. The metal wiring layer 216 is formed by embedding wiring material according to a well known electrolytic plating method or the like. As the wiring material, like the metal wiring layer 104 which is the first layer, a low-resistance wiring material such as copper (Cu) wiring, aluminum (Al) wiring and aluminum alloy wiring is employed.

As described above, the pattern is formed with the multi-layered film composed of three layers and the object to be processed is etched with the pattern as a mask. As a result, the semiconductor device having the multi-layered wiring structure can be produced at a high precision through these production processes.

In the production processes shown in FIG. 7A to FIG. 7F, the via hole is formed in a step shown in FIG. 7B while the wiring groove 214 is formed in a step shown in FIG. 7E. However, it is not always necessary to form these in this order but it is permissible to form the wiring groove 214 first followed by the formation of the via hole 210.

According to the embodiment, as described above, the mask pattern is formed with the multi-layered film composed of three layers so as to form the multi-layered wiring structure. Contrary to this, it is permissible to form a mask pattern using a multi-layered film composed of two layers and then process the object to be processed or the interlayer insulating film with the mask pattern so as to form the multi-layered wiring structure.

In this case, as the interlayer insulating film, an insulating film having a low relative dielectric constant of 3.9 or less is used. The insulating film of low relative dielectric constant is, for example, an insulating film containing organic component (carbon hydride (CH) or the like) such as organic silicon oxide film. The multi-layered film composed of two layers is formed on a object to be processed formed as shown in FIG. 7A or the interlayer insulating film 206 by a well known coating method such as spin coating method, so that the lower layer film and the upper layer film are formed in order. The lower layer film has an aromatic ring like when the multi-layered film composed of three layers is used and the carbon (atom) content thereof is 80 wt % or more, preferably more 90 wt % or more. The film is so hard that it has a high etching resistance.

The photo resist film containing an inorganic component such as semiconductor element and metal element is used for the upper layer film. In the multi-layered film composed of two layers, the upper layer film serves as the upper layer film and the intermediate film in the multi-layered structure composed of three layers and is used as a mask when the lower layer film is etched so as to form a pattern. Therefore, the upper layer film needs to contain inorganic component. As examples of the inorganic component, silicon, aluminum, titan, tungsten, germanium and the like can be picked up.

In the embodiment, a case where a mask pattern is formed using multi-layered film composed of two layers will be described. First, a pattern is formed by executing the exposure process and development process onto the upper layer film by lithography technology. Here, exposure light is irradiated to the photo resist film containing an inorganic component such as silicon through an exposure mask (reticle) in which via/contact hole, wiring or the like is drawn. After that, an unnecessary portion of the photo resist film is removed using development solution so as to form a predetermined pattern on the upper layer film.

Next, with the pattern in the upper layer film as a mask, the organic base film as the lower layer film whose carbon (atom) content is about 93 wt % is processed by dry etching technology so as to form a mask pattern following the shape and dimensions of the pattern in the upper layer film on the object to be processed. As the dry etching technology, the RIE method or the like is used. As the etching gas, mixture gas of oxygen ($O_2$) and nitrogen ($N_2$) is used.

In case for forming the multi-layered wiring structure such as dual damascene wiring according to the embodiment, the multi-layered film composed of two layers may be formed using photo resist film containing an inorganic component such as silicon, instead of the upper layer film and intermediate film in the three layered structure. By forming a pattern in the multi-layered film and then, use the pattern as a mask, the via hole and wiring groove may be formed in the interlayer insulating film in the same procedure as described above.

When forming the mask pattern on the object to be processed using the multi-layered film of two layers, the quantity of steps can be reduced as compared to a case where the mask pattern is formed of the multi-layered film of the three-layer structure. On the other hand, when forming the mask pattern from the multi-layered film composed of three layers, the intermediate film having a larger etching selection ratio (difference of etching value per unit time) may be used as a mask member in a process for forming a pattern in the organic base film, which is a lower layer film. Therefore, the dry etching technology using a predetermined etching gas enables the organic base film in the lower layer to be processed at a high precision, so that the mask pattern is formed in a predetermined shape and dimensions.

Meanwhile, according to the embodiment, as the dry etching technology, the reactive ion etching (RIE) method is employed. However, the dry etching technology is not restricted to the RIE method, but in any case for forming a mask pattern in the multi-layered film of two layer type or three layer type, any appropriate method may be used if it is suitable for fine processing of the semiconductor. For example, magnetron reactive etching method, electron beam ion etching method, ICP etching method, ECR ion etching method and the like may be employed.

According to the embodiment, in any case for forming the mask pattern from the multi-layered film of two layer type or three layer type, organic base film whose carbon (atom) content is 80 wt % or more, preferably 90 wt % or more is used as a lower layer film. Therefore, by using organic base film thinner than the conventional photo resist film (whose carbon (atom) content is about 70 wt %) and having a high etching resistance as a mask material, the via/contact hole, wiring groove and the like can be formed in the interlayer insulating film which is the object to be processed, at a high precision even in the multi-layered wiring structure such as dual damascene wiring method. Particularly, even if organic silicon oxide film having a low relative dielectric ratio or the like is employed in the interlayer insulating film, etching selection ratio (difference of etching value per unit time) between the lower layer organic film serving as the mask material and the interlayer insulating film can be increased, so that the via hole and wiring groove can be formed at a high precision.

Further, because according to the embodiment, organic base film having a high etching resistance is used, each mask pattern can be maintained in substantially constant thickness even after the via hole is formed in the interlayer insulating film. Thus, according to the embodiment, by leaving each mask pattern on the interlayer insulating film after the via hole is formed, this may be used as part of the multi-layered film, so as to form a mask pattern for forming the wiring groove. As a result, a process for removing the lower layer film can be eliminated, thereby making it possible to suppress deterioration of the interlayer insulating film, rise of relative dielectric ratio and the like. Particularly, a rise of the relative dielectric ratio can be suppressed in a fine region in which resistance is likely to rise such as the via hole. Therefore, it is possible to produce the semiconductor device without damaging the features of the wiring having a low resistance such as copper (Cu) wiring and low dielectric ratio insulating film.

According to the embodiment, by using organic base film having aromatic ring and carbon (atom) content of 80 wt % or more as a mask material, the object to be processed is etched. Because such organic base film contains a larger amount of carbon (atom) than the conventional photo resist, it has a higher etching resistance when it is used as a mask material. Thus, if the etching processing time on the object to be processed is assumed to be the same, the film thickness can be formed smaller than when the conventional photo resist film is used as the mask material. Consequently, the mask pattern can be formed on the object to be processed at a higher precision corresponding to the etching processing time of the object to be processed, processing condition of materials and the like.

According to the embodiment of the present invention, it is possible to provide a manufacturing method of semiconductor device which despite acceleration of thinning of the mask material, can secure sufficient etching resistance as the mask material and prevent a drop of processing precision of the object to be processed.

Further, according to the embodiment of the present invention, it is possible to provide a manufacturing method of semiconductor device, which can reduce dimensional conversion value generated in a mask pattern after the processing in multi-layered resist method and improve processing precision of the object to be processed. In conclusion, even if miniaturization of the semiconductor device is accelerated, according to the embodiment of the present invention enables the object to be processed at a higher precision, thereby improving reliability of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of semiconductor device comprising:
   forming a mask material having an aromatic ring and carbon content of 80 wt % or more on an object;
   forming a mask material pattern by etching said mask material to a desired pattern; and
   etching said object to transfer said mask material pattern as a mask to said object.

2. A manufacturing method of semiconductor device according to claim 1, wherein forming said mask material pattern includes:
   forming an intermediate film having at least any one of semiconductor element and metal element on said mask material;
   forming a photo resist film on said intermediate film;
   forming a resist pattern by fabricating said photo resist film into a desired pattern;
   forming an intermediate film pattern by transferring said resist pattern to said intermediate film; and
   transferring said intermediate film pattern to said mask material to form said mask material pattern.

3. A manufacturing method of semiconductor device according to claim 1, wherein the carbon content of said mask material is 90 wt % or more.

4. A manufacturing method of semiconductor device according to claim 1, wherein said mask material is formed by coating with solution.

5. A manufacturing method of semiconductor device according to claim 4, wherein after coating of said solution, the carbon content of said mask material is increased by dehydrogenating reaction or dehydrating condensation.

6. A manufacturing method of semiconductor device according to claim 5, wherein at least any one of said dehydrogenating reaction and said dehydrating condensation is carried out by heating.

7. A manufacturing method of semiconductor device according to claim 4, wherein said solution contains polycyclic aromatic compound.

8. A manufacturing method of semiconductor device according to claim 7, wherein the average molecular weight of said polycyclic aromatic compound is in a range of 1,000 to 100,000.

9. A manufacturing method of semiconductor device comprising:
   forming a mask material having an aromatic ring and carbon content of 80 wt % or more on an object;
   forming a photo resist film on said mask material;
   forming a resist pattern by fabricating said photo resist film into a desired pattern;
   forming a mask material pattern by transferring said resist pattern to said mask material; and
   etching said object to transfer said mask material pattern as a mask to said object.

10. A manufacturing method of semiconductor device according to claim 9, wherein said resist pattern is obtained by a wet development method.

11. A manufacturing method of semiconductor device according to claim 10, wherein said resist pattern contains at least any one of semiconductor element and metal element.

12. A manufacturing method of semiconductor device according to claim 9, further comprising,
   silylating said resist pattern after forming said resist pattern.

13. A manufacturing method of semiconductor device according to claim 9, wherein said resist pattern is obtained by a dry development method.

14. A manufacturing method of semiconductor device according to claim 9, wherein said mask material is formed by coating with solution.

15. A manufacturing method of semiconductor device according to claim 14, wherein after coating of said solution, the carbon content of said mask material is increased by dehydrogenating reaction or dehydrating condensation.

16. A manufacturing method of semiconductor device according to claim 15, wherein at least any one of said dehydrogenating reaction and said dehydrating condensation is carried out by heating.

17. A manufacturing method of semiconductor device according to claim 14, wherein said solution contains polycyclic aromatic compound.

18. A manufacturing method of semiconductor device according to claim 17, wherein the average molecular weight of said polycyclic aromatic compound is in a range of 1,000 to 100,000.

19. A manufacturing method of semiconductor device comprising:
   forming a first wiring layer above a semiconductor substrate with a first insulating film therebetween;
   forming a second insulating film on said first wiring layer and said first insulating film;

forming a first organic base film having an aromatic ring and carbon content of 80 wt % or more on said second insulating film;

forming a first inorganic film pattern containing a first inorganic component having at least any one of semiconductor element and metal element on said first organic base film;

forming a first organic film pattern of said first organic base film by transferring said first inorganic film pattern as a mask to said first organic base film;

forming any one of a hole and a groove in second insulating film by transferring said first organic film pattern as a mask to said second insulating film;

forming a second organic base film having an aromatic ring and carbon content of 80 wt % or more on said first organic film pattern;

forming a second inorganic film pattern containing a second inorganic component having at least any one of semiconductor element and metal element on said second organic base film;

forming a second organic film pattern of said second organic base film by transferring said second inorganic film pattern as a mask to said second organic base film;

forming any one of a groove and a hole in said second insulating film by transferring said second organic film pattern as a mask to said second insulating film; and forming a second wiring layer keeping contact with said first wiring layer by embedding a conductive material in said groove and said hole.

20. A manufacturing method of semiconductor device according to claim 19, wherein the carbon content of said first organic base film and said second organic base film are respectively 90 wt % or more.

21. A manufacturing method of semiconductor device according to claim 19, wherein said first and second organic base films are formed by coating with solution.

22. A manufacturing method of semiconductor device according to claim 21, wherein said solution contains polycyclic aromatic compound.

23. A manufacturing method of semiconductor device according to claim 19, wherein said second insulating film is a low-dielectric-constant insulating film.

* * * * *